(12) United States Patent
Uchino et al.

(10) Patent No.: US 7,432,180 B2
(45) Date of Patent: Oct. 7, 2008

(54) METHOD OF FABRICATING A NICKEL SILICIDE LAYER BY CONDUCTING A THERMAL ANNEALING PROCESS IN A SILANE GAS

(75) Inventors: Yasunori Uchino, Kawasaki (JP); Kazuo Kawamura, Kawasaki (JP); Naoyoshi Tamura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 346 days.

(21) Appl. No.: 11/434,132

(22) Filed: May 16, 2006

(65) Prior Publication Data
US 2007/0166974 A1    Jul. 19, 2007

(30) Foreign Application Priority Data
Jan. 17, 2006    (JP)    ............................. 2006-008946

(51) Int. Cl.
    H01L 21/28    (2006.01)
    H01L 21/44    (2006.01)
(52) U.S. Cl. ............... 438/581; 438/583; 257/E21.438; 257/E21.439
(58) Field of Classification Search ................. 438/581, 438/583; 257/E21.438, E21.439
    See application file for complete search history.

(56) References Cited

U.S. PATENT DOCUMENTS

2007/0015360 A1 * 1/2007 Lu et al. ..................... 438/682

FOREIGN PATENT DOCUMENTS

| JP | 61-12851 | 1/1986 |
|----|----------|--------|
| JP | 61-128521 A | 1/1986 |
| JP | 2004-356216 | 12/2004 |

* cited by examiner

Primary Examiner—Charles D. Garber
Assistant Examiner—Stanetta D Isaac
(74) Attorney, Agent, or Firm—Westerman, Hattori, Daniels & Adrian, LLP.

(57) ABSTRACT

A method of fabricating a semiconductor device comprises the step of forming a nickel monosilicide layer selectively over a silicon region defined by an insulation film by a self-aligned process. The self-aligned process comprises the steps of forming a metallic nickel film on a silicon substrate on which the insulation film and the silicon region are formed, such that the metallic nickel film covers the insulation film and the silicon region, forming a first nickel silicide layer primarily of a $Ni_2Si$ phase on a surface of the silicon region of the metallic nickel film by applying an annealing process to the silicon substrate, removing the metallic nickel film, after the step of forming the first nickel silicide layer, by a selective wet etching process, and converting the first nickel silicide layer to a second nickel silicide layer primarily of a NiSi phase by a thermal annealing process conducted in a silane gas.

14 Claims, 22 Drawing Sheets

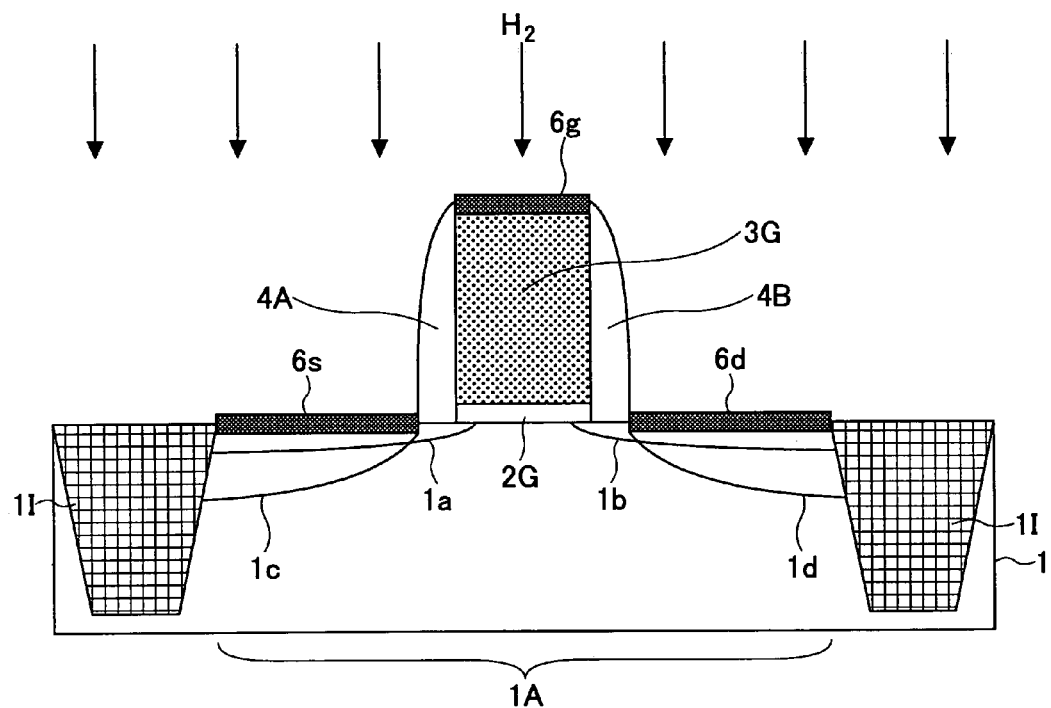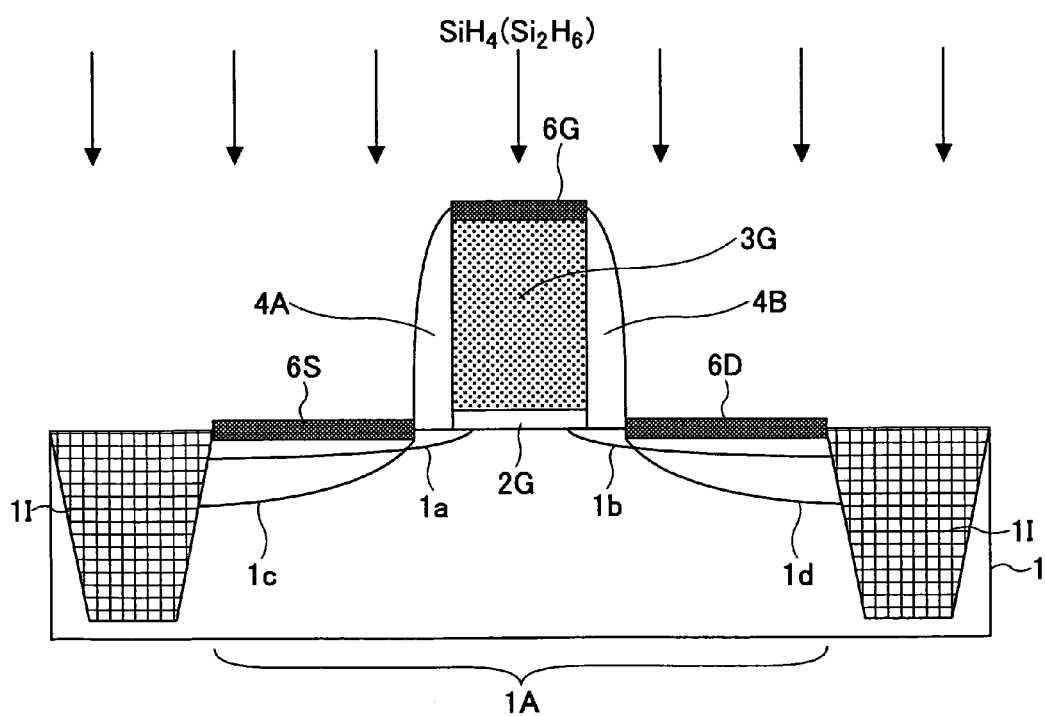

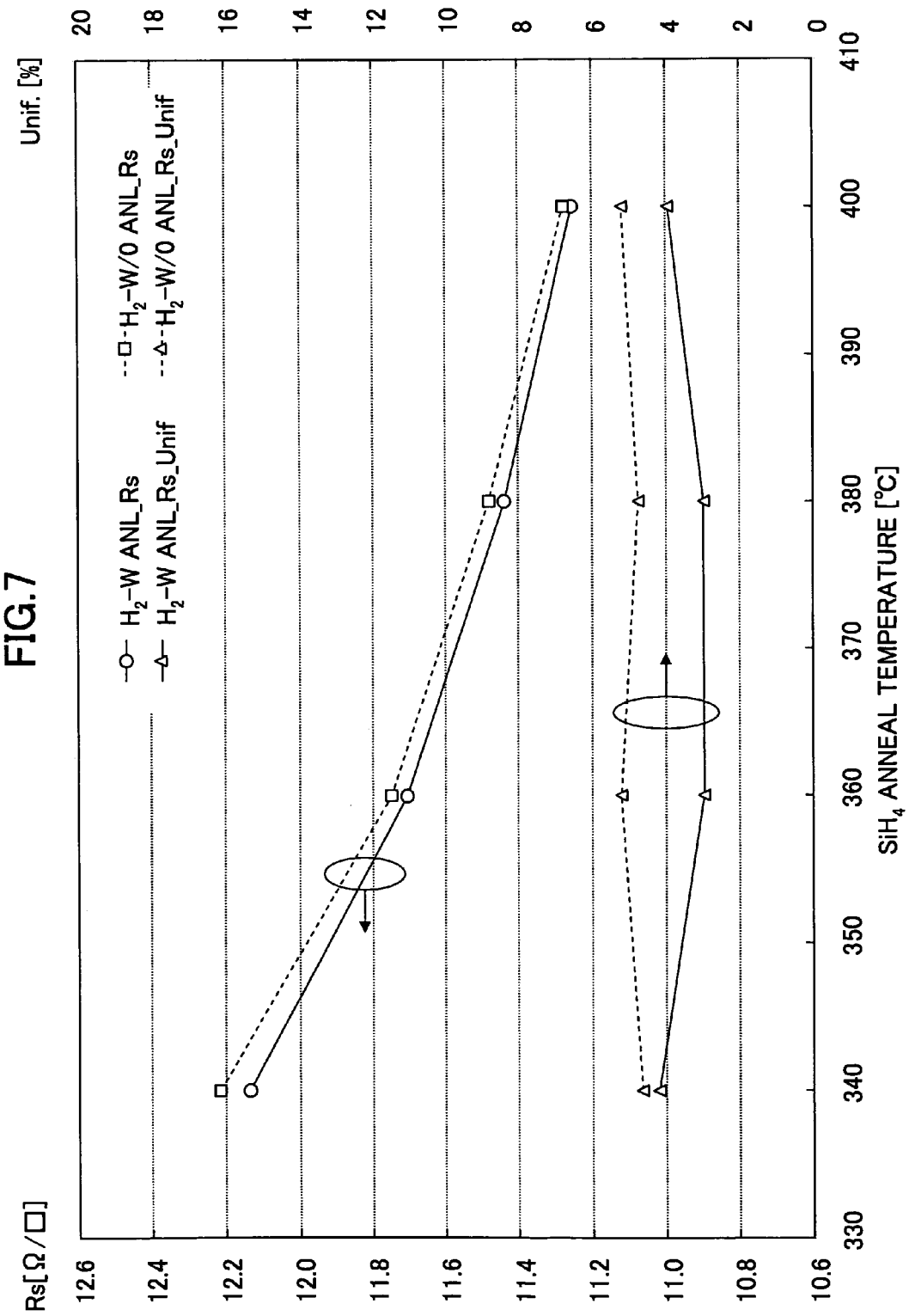

METHOD OF FABRICATING A NICKEL SILICIDE LAYER BY CONDUCTING A THERMAL ANNEALING PROCESS IN A SILANE GAS

CROSS-REFERENCE TO RELATED APPLICATION

The present application is based on Japanese priority application No. 2006-008946 filed on Jan. 17, 2006, the entire contents of which are hereby incorporated by reference.

BACKGROUND OF THE INVENTION

The present invention generally relates to semiconductor devices and more particularly to the fabrication process of a semiconductor device that includes a low-resistance nickel silicide film, particularly a nickel monosiliside film of a NiSi phase on an impurity diffusion region or gate electrode formed on a semiconductor substrate.

In the art of MOS semiconductor integrated circuit devices, steady progress is being made with regard to improvement of integration density and miniaturization of device size for the purpose of achieving higher operational speed, further diversity of functions, larger memory capacity, further decrease of electric power consumption, or the like. Today, there is already realized a semiconductor device having a gate length of 100 nm or less, while with such ultra-miniaturized semiconductor devices, there arise various problems in relation to decrease of the gate length. Thus, innovation of the conventional art is inevitable.

Conventionally, a vertical interconnection structure such as contact structure has been used extensively in semiconductor devices formed on a silicon substrate for electrically interconnecting a diffusion region formed in the silicon substrate with an interconnection pattern.

With such a contact structure, an electric interconnection is made to the surface of the diffusion region by way of a contact plug. Thereby, in order to reduce the contact resistance, it is practiced in the art to form a low-resistance silicide layer on the surface of the diffusion region to which the contact plug makes a contact.

Conventionally, such a silicide layer is formed by a so-called salicide process in which a metal film is deposited on a silicon surface, followed by a thermal annealing process such that there is caused a reaction between the metal film and the silicon surface. After the thermal annealing process, the metal film remaining unreacted is removed by a selective wet etching process.

In the case of ultra-miniaturized semiconductor devices of these days called 65 nm-node generation devices or newer and characterized by the gate length of 35 nm or less, it is preferable to suppress the junction depth of the source/drain diffusion regions to be 100 nm or less in view of the need of suppressing the short channel effect.

In relation to this, there is an increasing need of using nickel silicide, which can be formed with thermal annealing process at the temperature of 400° C. or less, in the salicide process, such that the distribution profile of the impurity elements constituting the shallow junction is not modified with the thermal annealing process. In addition, nickel silicide can be formed also on a SiGe mixed crystal region with reliability. Thus, nickel silicide is an indispensable material in the ultra-fast semiconductor devices that achieve improvement of operational speed by way of stressing.

REFERENCES

Reference 1 Japanese Laid-Open Patent Application 61-128521

Reference 2 Japanese Laid-Open Patent Application 2004-356216

SUMMARY OF THE INVENTION

With such an ultra-miniaturized and ultra-fast semiconductor device characterized by the junction depth of 100 nm or less, it is preferable to control the depth of the silicide region formed by the salicide process as small as possible, such that the silicide formation reaction does not take place below the junction interface when forming the silicide layer on the surface of the diffusion region.

Thus, Patent Reference 2 discloses the technology of so-called elevated silicide, in which a silicide formation reaction is caused not only at the interface between the metal film and the silicon surface but also at the top surface of the metal film at the time of the salicide process, by supplying a silane gas simultaneously to the salicide process.

In the conventional process of formation of nickel silicide, a metallic nickel film is deposited on the silicon surface and a nickel silicide layer of $Ni_2Si$ phase is formed by causing a reaction between the nickel film and the Si atoms on the silicon surface. The silicide layer of the $Ni_2Si$ phase is then subjected to a thermal annealing process, wherein the $Ni_2Si$ phase is converted to a nickel monosilicide layer of NiSi phase characterized by low resistivity.

According to such an elevated silicide formation technology, the Ni atoms on the surface part of the metallic nickel film are consumed by the silicide formation reaction caused by the silane gas by supplying the silane gas to the surface of the metallic nickel film at the time of the reaction between the metallic nickel film and the silicon surface as noted before, and the amount of the Ni atoms causing reaction with the silicon surface is reduced. With this, it becomes possible to reduce the depth of the silicide layer formation region invading into the silicon substrate.

Meanwhile, the inventor of the present invention has discovered, in the investigation that constitutes the foundation of the present invention, that there can also be a case in which the Ni atoms cause diffusion deeply into the silicon surface at the time of the thermal annealing process conducted for converting the nickel silicide layer of the $Ni_2Si$ phase, formed by the reaction between the silicon substrate surface and the metallic Ni film, to the low-resistance nickel monosilicide layer of the NiSi phase. It should be noted that such diffusion of the Ni atoms across the junction interface destroys the junction and causes increase of junction leakage current.

Further, the inventor of the present invention has discovered, in the investigation that constitutes a foundation of the present invention, that there is easily formed a native oxide film on the surface of the nickel silicide layer of the $Ni_2Si$ phase, and as a result, there is caused variation of sheet resistance in the nickel silicide film of the NiSi phase. It is believed that such a native oxide film is formed as a result of exposure of the $Ni_2Si$ phase nickel silicide film to the air at the time the residual nickel film is removed by the selective wet etching process after formation of the nickel silicide layer of the $Ni_2Si$ phase according to the salicide process.

In a first aspect, the present invention provides a method of fabricating a semiconductor device, comprising the step of forming a nickel monosilicide layer selectively over a silicon region defined by an insulation film by a self-aligned process, said self-aligned process comprising the steps of:

forming a metallic nickel film on a silicon substrate on which said insulation film and said silicon region are formed, such that said metallic nickel film covers said insulation film and said silicon region;

forming a first nickel silicide layer primarily of a $Ni_2Si$ phase on a surface of said silicon region of said metallic nickel film by applying an annealing process to said silicon substrate;

removing said metallic nickel film, after said step of forming said first nickel silicide layer, by a selective wet etching process; and converting said first nickel silicide layer to a second nickel silicide layer primarily of a NiSi phase by a thermal annealing process conducted in a silane gas.

In another aspect, the present invention provides a method of fabricating a semiconductor device, comprising the steps of:

forming a device isolation structure on a substrate such that said device isolation structure defines a device region in the form of a silicon surface;

forming a gate electrode over said device region via a gate insulation film formed on said silicon surface in said device region;

forming first and second sidewall insulation films on respective sidewall surfaces of said gate electrode;

forming a source region and a drain region in said substrate within said device region at respective outer sides of said first and second sidewall insulation films; and forming first and second nickel monosilicide layers primarily of a NiSi phase respectively on a surface of said source region and a surface of said drain region, said step of forming said first and second nickel monosilicide layers comprises the steps of depositing a metallic nickel film on said substrate so as to cover said source and drain regions and further said gate electrode including said first and second sidewall insulation films;

forming first and second nickel silicide layers primarily of a $Ni_2Si$ phase respectively on said surface of said source region and said surface of said drain region by applying a thermal annealing process to said metallic nickel film;

removing said metallic nickel film after formation of said first and second nickel silicide layers by a selective wet etching process; and converting said first and second nickel silicide layers respectively to a first and second nickel monosilicide layers in said source and drain regions by way of a thermal annealing process conducted in a silane gas ambient.

According to the present invention, invasion of Ni atoms from the nickel silicide layer of the $Ni_2Si$ phase into the silicon surface can be successfully suppressed by carrying out the thermal annealing process for converting the nickel silicide layer of the $Ni_2Si$ phase to the nickel monosilicide layer of the NiSi phase in the state of exposing the nickel silicide layer of the $Ni_2Si$ phase to the silane gas ambient. With this, it becomes possible to form the desired nickel monosilicide layer on the surface of the silicon region with a reduced depth, and the problem of the junction formed in the silicon region being destroyed by the diffusion of the Ni atoms and associated problem of variation and increase of the leakage current can be successfully eliminated. With such a construction, conversion to nickel monosilicide phase takes place also from the surface of the nickel silicide layer of the $Ni_2Si$ phase as a result of exposure to the silane gas, and as a result, it becomes possible to obtain the nickel monosilicide layer to have an extremely uniform and low sheet resistance.

Further, as a result of the reducing processing applied to the surface of the nickel silicide layer of the $Ni_2Si$ composition after removal of the metallic nickel film by the selective wet etching process but before conversion to the nickel monosilicide phase as a result of the thermal annealing processing applied to the nickel silicide layer of the $Ni_2Si$ composition, it becomes possible to reduce the sheet resistance of the obtained nickel monosilicide layer further.

Other objects and further features of the present invention will become apparent from the following detailed description when read in conjunction with the attached drawings.

BRIEF DESCRIPTION OF THE DRAWINGS

FIGS. 1A-1L are diagrams showing the fabrication process of semiconductor device according to a first embodiment of the present invention;

FIG. 7 is a diagram verifying the effect of the processing of the step 5 of FIG. 2 conducted in the reducing ambient;

DETAILED DESCRIPTION OF THE INVENTION

First Embodiment

Figure 1A:
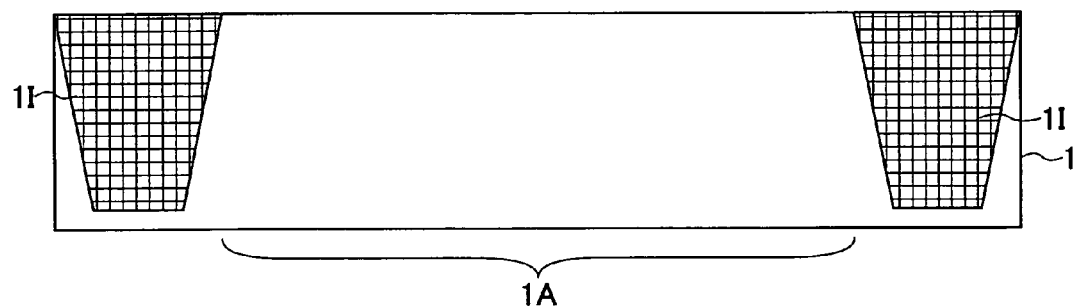
Figure 1B:
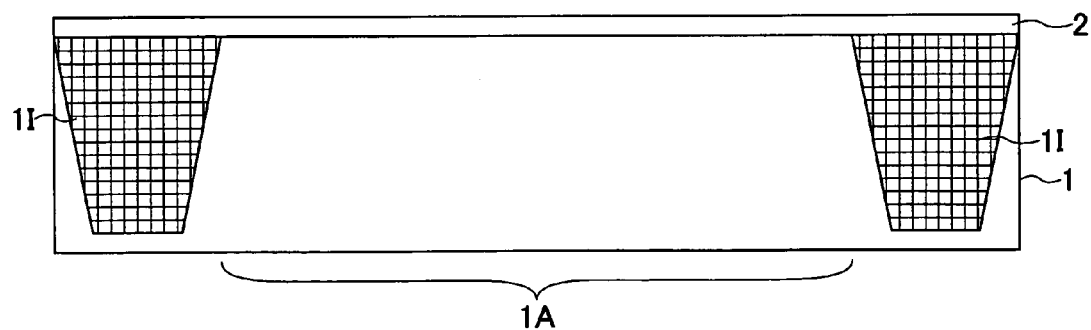
Figure 1C:
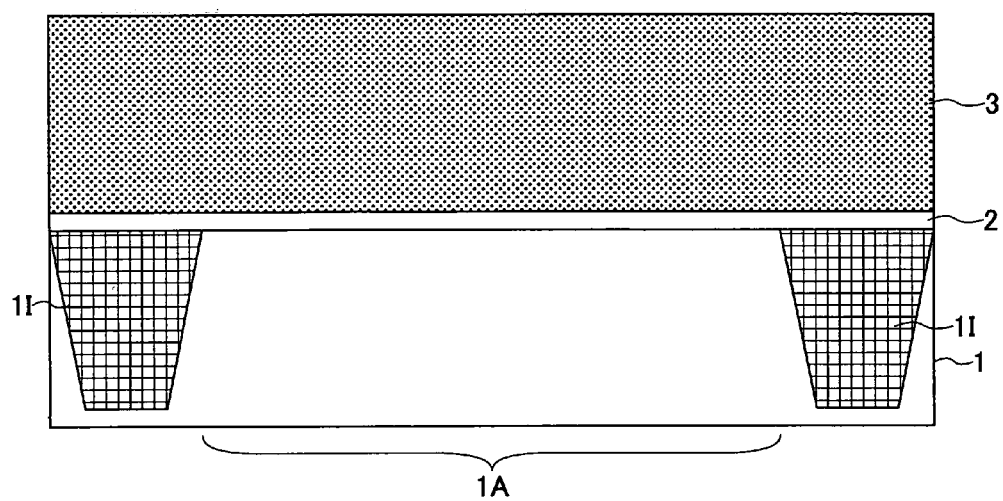
Figure 1D:
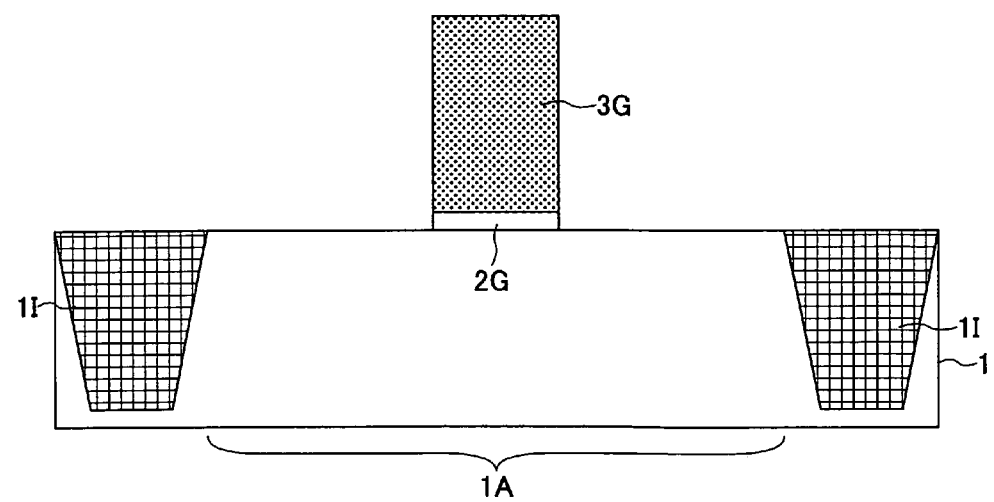
Figure 1E:
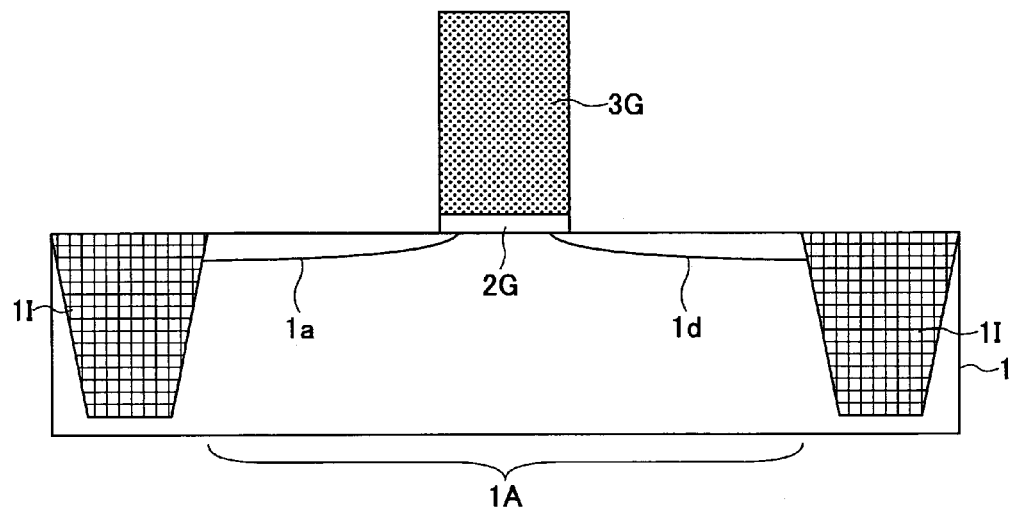
Figure 1F:
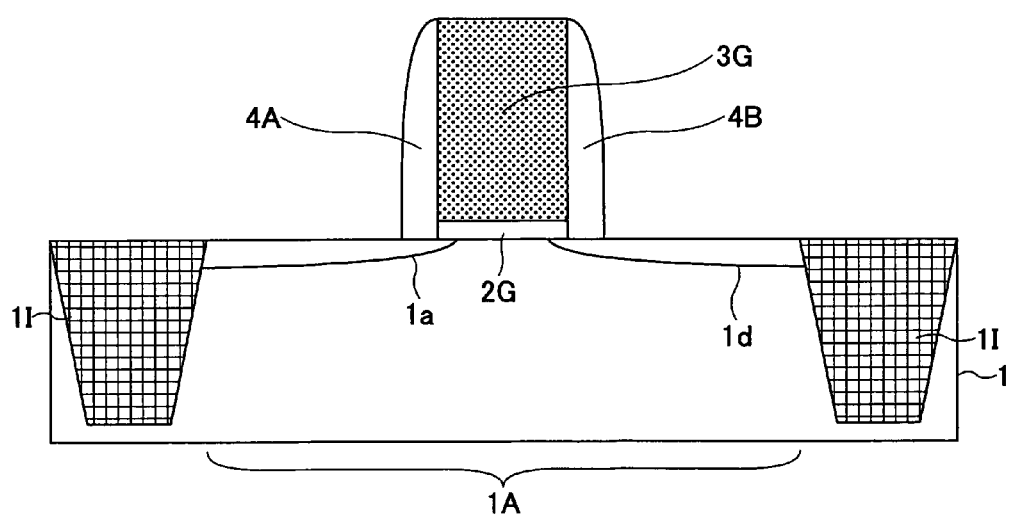
Figure 1G:
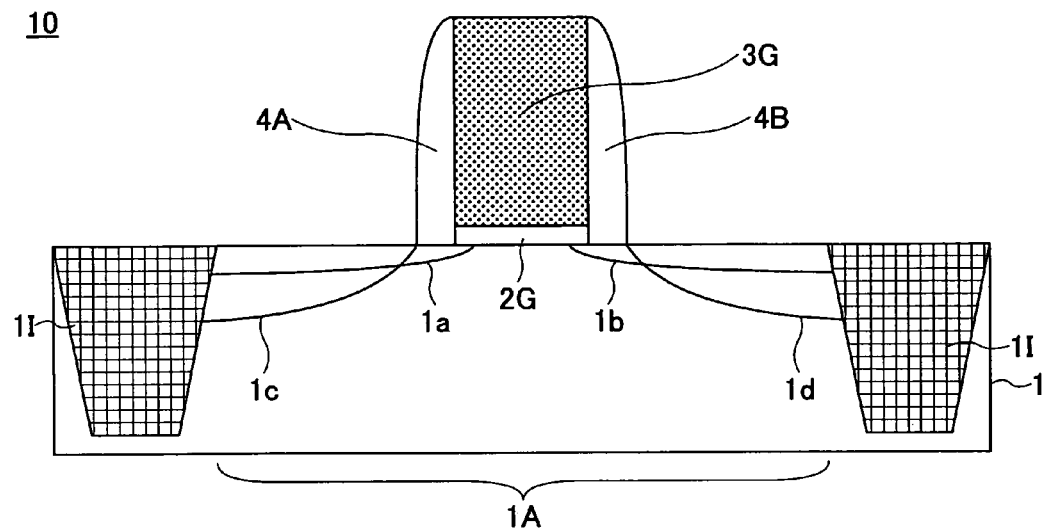
Figure 1H:
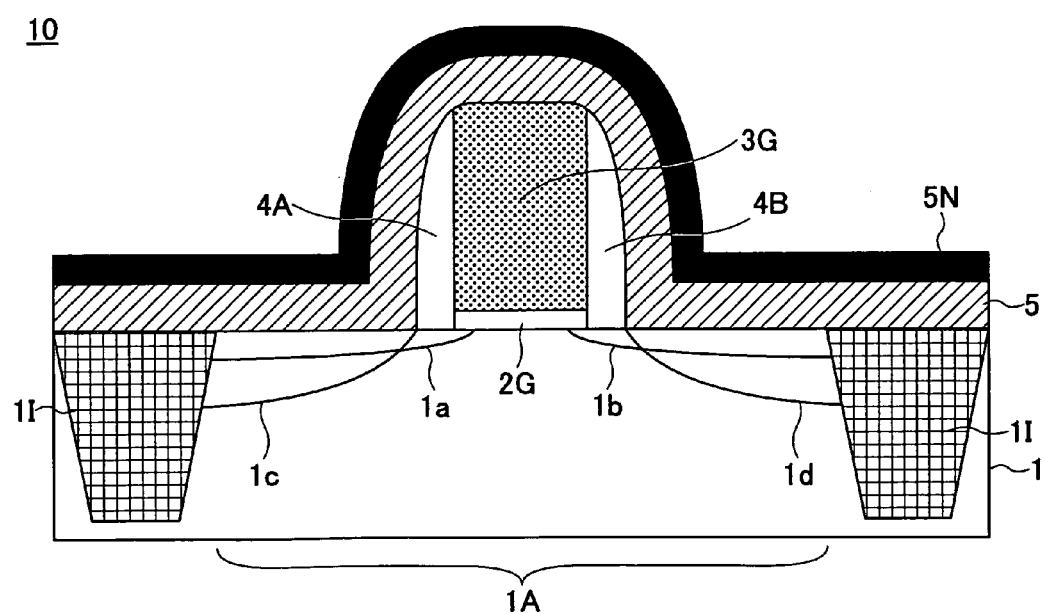
Figure 1I:
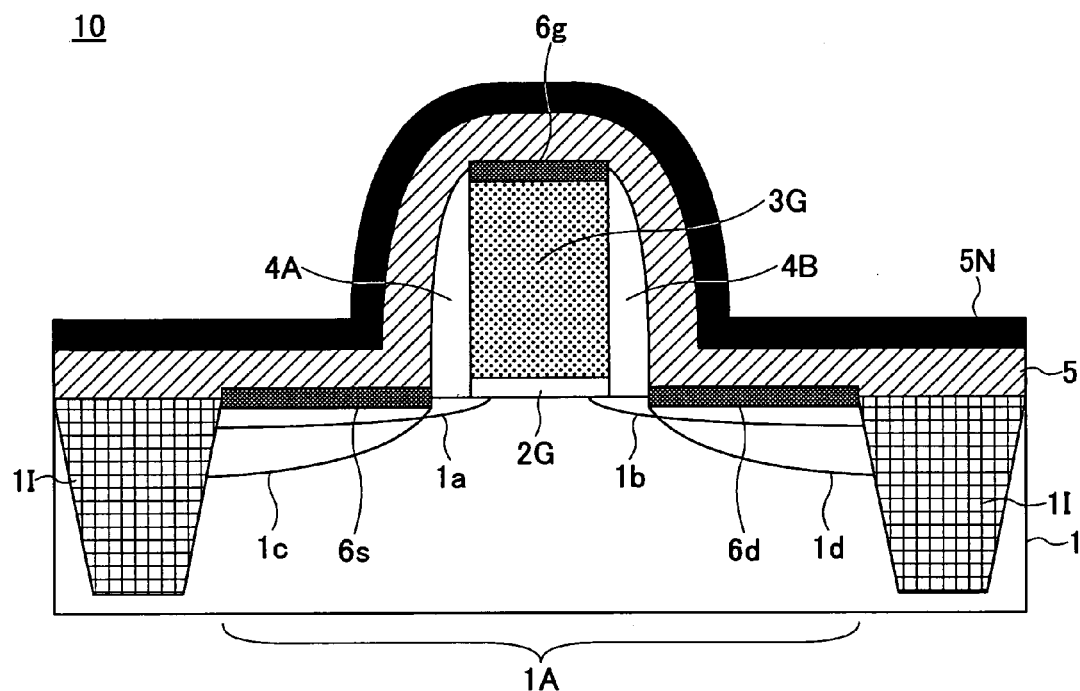
Figure 1J:
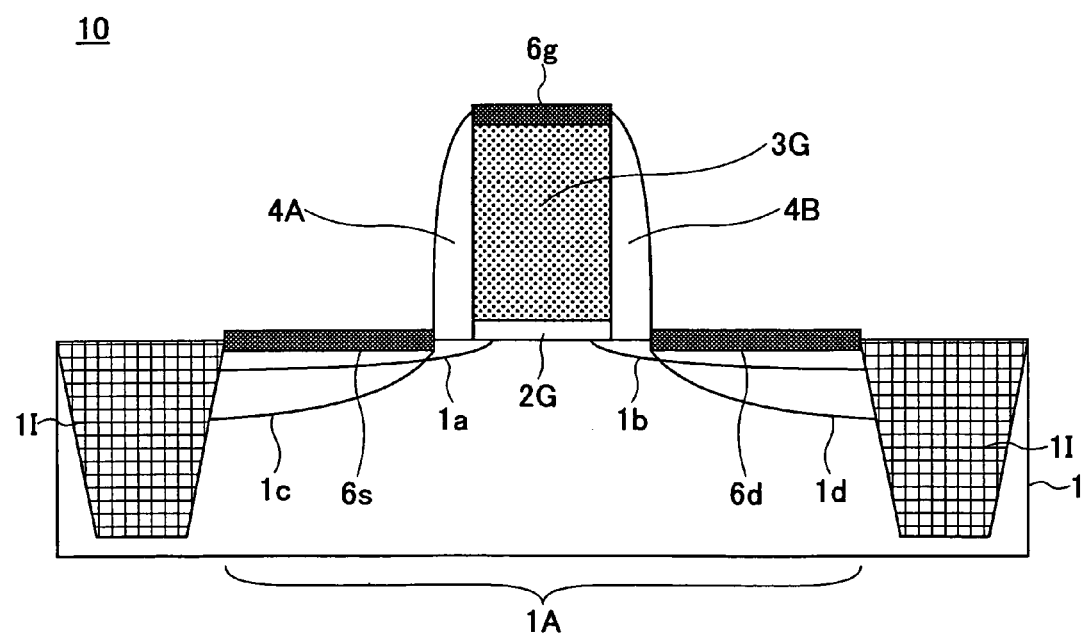
Figure 2:
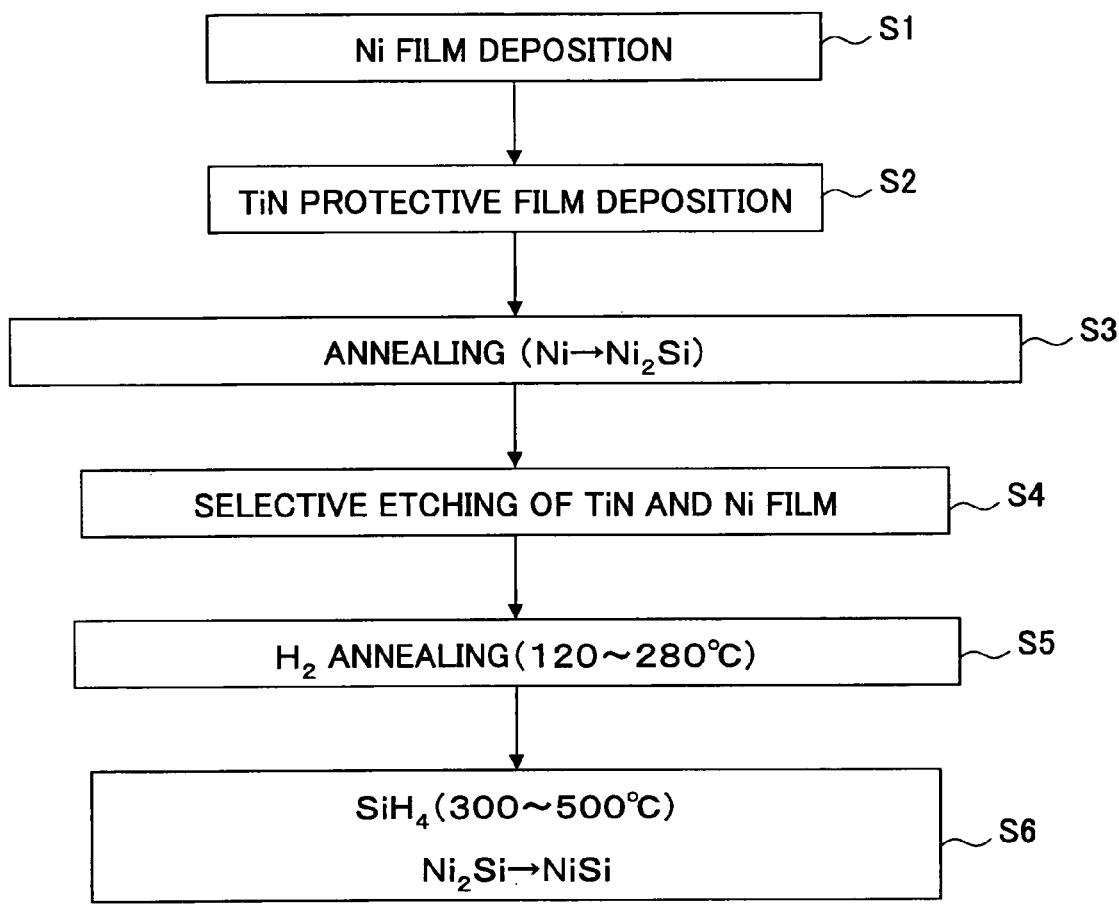
FIG. 2 is a flowchart showing the fabrication process of a semiconductor device corresponding to the process of FIGS. 1H-1L.

FIGS. 1A-1L are diagrams showing the fabrication process of a semiconductor device 10 according to a first embodiment of the present invention, while FIG. 2 shows the flowchart corresponding to the steps of FIGS. 1H-1L.

Referring to FIG. 1A, the semiconductor device 10 is an n-channel MOS transistor formed on a silicon substrate 1, wherein the silicon substrate is formed with a device region 1A by a device isolation region 1I of STI (shallow trench isolation) structure. The device region 1A may be formed with a p-type well (not shown), for example.

Next, in the step of FIG. 1B, an SiON film 2 is formed on the silicon substrate 1 with a thickness of 1-2 nm, and a polysilicon film 3 is formed on the SiON film 2 in the step of FIG. 1C.

Next, in the step of FIG. 1D, the polysilicon film and the SiON film 2 underneath thereof are subjected to a patterning process, and as a result, there are formed a polysilicon gate electrode 3G and an SiON gate insulation film 2G. In the illustrated example, the semiconductor device 10 is an n-channel MOS transistor of the 60 nm node or later, and the polysilicon gate electrode 3G may be formed with a gate length of 35 nm or less.

Next, in the step of FIG. 1E, P+ or As+ is introduced into the device region 1A by an ion implantation process typically under the acceleration voltage of 1-5 keV with the dose of $5-9 \times 10^{14}$ cm$^{-2}$ while using the gate electrode 3G as a mask, and as a result, there are formed diffusion regions 1a and 1b of n-type in the silicon substrate 1 at respective sides of the gate electrode 3 typically with the junction thickness of 20 nm or less as the source and drain extension regions.

Next, in the step of FIG. 1F, sidewall insulation films 4A and 4B are formed on the respective sidewall surface of the gate electrode 3G, and n$^+$-type diffusion regions 1c and 1d are formed in the silicon substrate 1 at respective outer sides of the sidewall insulation films 4A and 4B by an ion implantation process of P+ or As+ while using the gate electrode 3G and the sidewall insulation films 4A and 4B as a mask. In the case of introducing P+, the ion implantation process is conducted under the acceleration voltage of 6-15 keV with the dose of $5 \times 10^{13}$-$10^{16}$ cm$^{-2}$, while in the case of introducing As+, the ion implantation process is conducted under the acceleration voltage of 35-40 keV with the dose of $10^{15}$ cm$^{-2}$.

Next, in the step of FIG. 1H, the structure of FIG. 1G is introduced into a sputtering apparatus (not shown), and after cleaning silicon surface by DHF or dry chemical cleaning, a metallic nickel film 5 is formed on the structure of FIG. 1G in correspondence to a step 1 of the flowchart of FIG. 2 typically with the thickness of 10-50 nm by a sputtering process while using a Ni target. Further, a TiN film 5N is formed on the metallic nickel film 5 with a thickness of 10 nm, for example, by a reactive sputtering process in correspondence to a step 2 of FIG. 1H as a protective film.

Next, in the step of FIG. 1I, the structure of FIG. 1H is moved from the sputtering apparatus to a film forming apparatus such as a low-pressure CVD apparatus, and a silicide formation process is conducted as explained below in correspondence to a step 3 of FIG. 2.

More specifically, the metallic nickel film 5 is caused to react, in the step of FIG. 1I, with surface of the source region 1c, the drain region 1d and the gate electrode 3G by subjecting the structure of FIG. 1H to a thermal annealing process in an inert gas ambient such as Ar ambient under the pressure of 0.3 Pa at the temperature of 200-270° C., preferably 240° C. for 180 seconds. As a result, there are formed nickel silicide films 6s, 6d and 6g having a composition represented primarily by Ni$_2$Si respectively on the source region 1c, the drain region 1d and the gate electrode 3G typically with a thickness of 12-20 nm.

Next, in the step of FIG. 1J corresponding to a step 4 of FIG. 2, the metallic nickel film 5 and the TiN layer 5N on the surface thereof are removed by an ordinary selective wet etching process that uses an SPM etchant, which is a mixture of sulfuric acid and hydrogen peroxide water. Further, in the step of FIG. 1K corresponding to a step 5 of FIG. 2, the structure of FIG. 1J is subjected to a reducing process in a hydrogen gas ambient at the temperature of 120-280° C. for 20-300 seconds. Here, it should be noted that the ambient of the reducing processing of FIG. 1K is by no means limited to hydrogen gas ambient but other reducing ambient may also be used as long as it is possible to reduce a nickel oxide film.

Next, in the step of FIG. 1L corresponding to a step 6 of FIG. 2, the structure of FIG. 1K is subjected to a thermal annealing process in a silane (SiH$_4$) gas ambient at the temperature of 300-500° C., preferably 340-400° C. for 30-600 seconds. With this, the silicide layers 6s, 6d and 6g formed primarily of the Ni$_2$Si phase are converted respectively to low resistance nickel monosilicide layers 6S, 6D and 6G of a NiSi phase. Here, it should be noted that the process of FIG. 1L can also be conducted in the ambient other than the monosilane gas ambient. For example, the process of FIG. 1L may be conducted in an ambient of disilane (Si$_2$H$_6$).

By carrying out such a conversion processing in the step of FIG. 1L in the ambient of silane gas, it should be noted that the conversion reaction to monosilicide proceeds also from the surface part of the silicide layers 6s, 6d and 6g, and the problem of penetration of the nickel monosiliside layers 6S and 6D into the shallow diffusion regions 1c and 1d can be effectively suppressed.

Figure 3A:
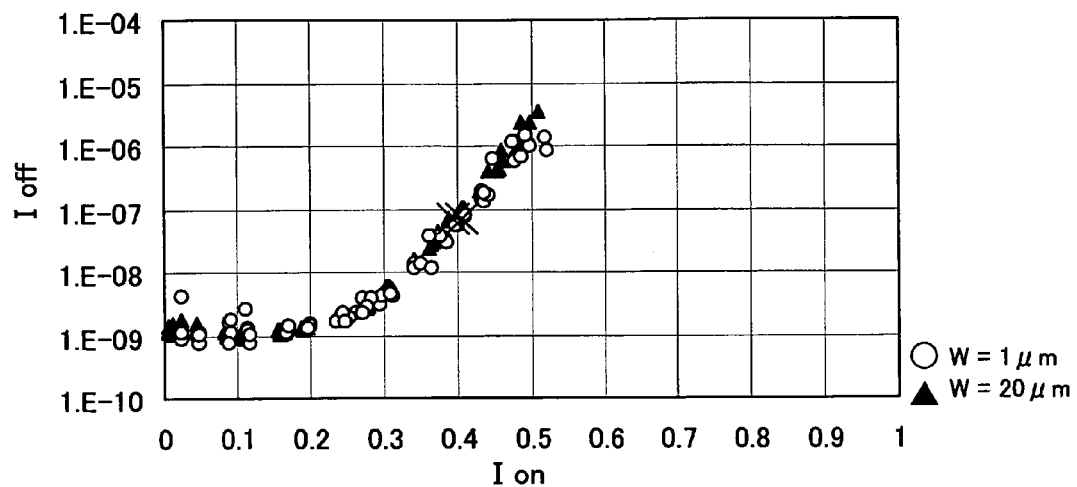
FIG. 3A is a diagram showing the characteristics of the transistor obtained for the case the thermal annealing process of the step 6 of FIG. 2 has been conducted in a silane gas ambient.

FIG. 3A shows the ON/OFF current characteristics of the n-channel MOS transistor having the diffusion regions 1c and 1d thus obtained.

In the experiment, specimens having the gate width W of 20 μm and the specimens having the gate width of 1 μm were fabricated. Referring to FIG. 3A, it can be seen that similar characteristics are obtained for both of these specimens as long as the thermal annealing processing is conducted at the temperature of 400° C. in the step of FIG. 1L.

Figure 3B:
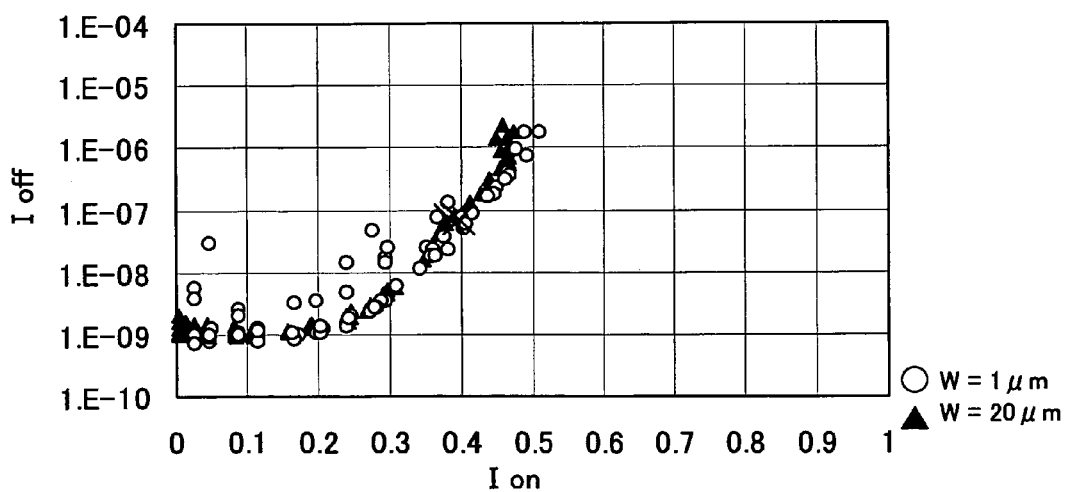
FIG. 3B is a diagram showing the characteristics of the transistor obtained for the ease the thermal annealing process of the step 6 of FIG. 2 is conducted in an inert gas ambient.

Contrary to this, FIG. 3B shows the specimen subjected to a thermal annealing process at 400° C. in an Ar gas ambient in the step of FIG. 1L.

Referring to FIG. 3B, it can be seen that there appears a large scattering in the characteristics with the specimen having the gate width W of 1 μm, in contrast to the specimen of the gate width W of 20 μm.

Figure 4:
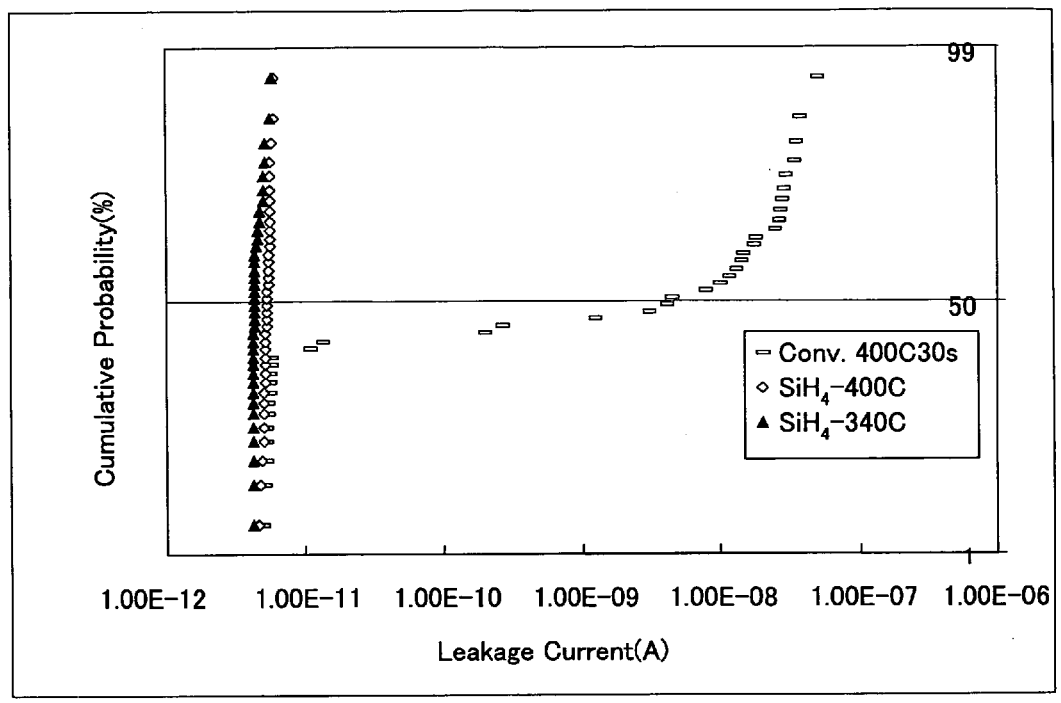
FIG. 4 is a diagram showing the cumulative frequency distribution of the junction leakage current in the source/drain regions of the transistors fabricated according to the process of FIG. 2 in comparison with a comparative example.

FIG. 4 shows the cumulative frequency distribution of leakage current for the n-type diffusion regions 1c and 1d formed according to the process of the present embodiment.

Referring to FIG. 4, it can be seen that the variation of leakage current is almost zero and that the leakage current takes the value of $1 \times 10^{-11}$ A/cm$^2$ or less, in any of the case in which the step of FIG. 1L is conducted in the silane gas ambient at 400° C. and at 340° C. In the case of the comparative example in which the process of FIG. 1L is conducted in a nitrogen gas ambient at 400° C. for 30 seconds, there arises a large variation of leakage current and that the leakage current takes the value exceeding $1 \times 10^{-8}$ A/cm$^2$ with the specimens of 50% or more. This indicates that the junction at the source and drain regions 1c and 1d is destroyed by the silicide formation reaction in substantial number of specimens.

Contrary to the foregoing, there is observed no variation of leakage current with the present embodiment, and it can be seen that the leakage current has been reduced to 1/1000-1/10000 as compared with most specimens of the comparative example. This indicates that the nickel monosilicide layers 6S and 6D are formed without destroying the shallow junction of the diffusion regions 1c and 1d.

Figure 5:
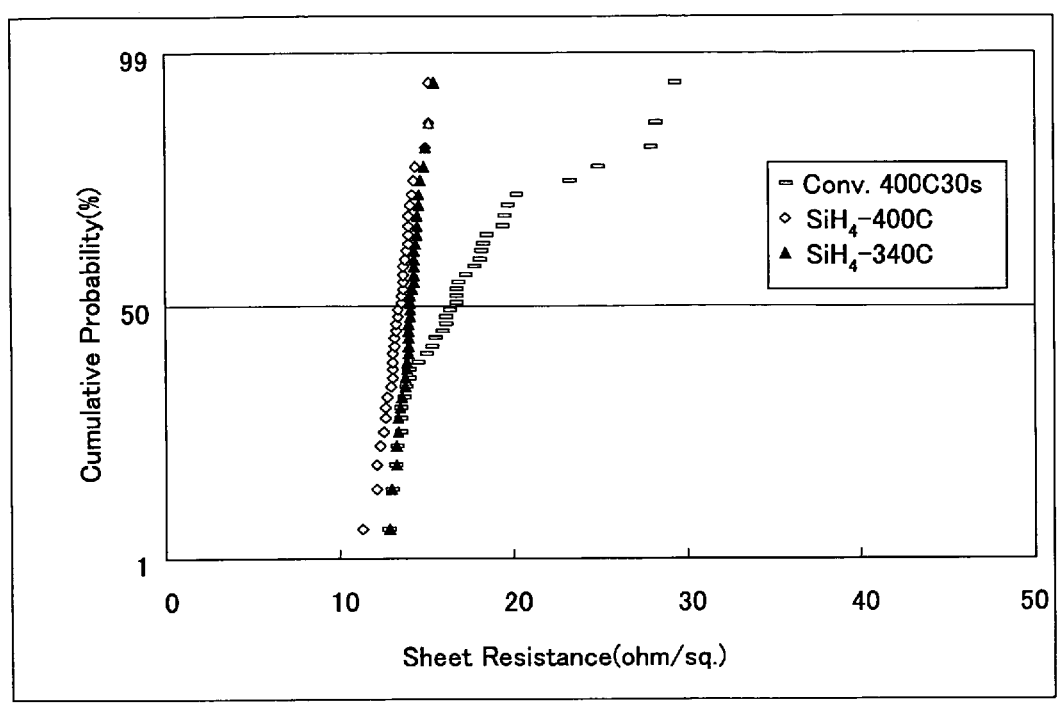
FIG. 5 is a diagram showing the cumulative frequency distribution of sheet resistance of the nickel monosilicide layers formed on the gate electrodes of the transistors fabricated according to the process of FIG. 2 in comparison with a comparative example.

FIG. 5 shows the cumulative frequency distribution of sheet resistance for the case in which a nickel monosilicide pattern is formed on a polysilicon film of n$^+$-type in correspondence to the silicide layer 6G of FIG. 1L with a width of 40 nm according to the process steps 1-6 of FIG. 2.

Referring to FIG. 5, there is caused little variation of sheet resistance in the case the process step 6 is conducted in the monosilane ambient at the temperature of 400° C. or 340° C. and that a sheet resistance value of 10-15 Ω/□ is attained.

In the case the process step 6 is carried out in the nitrogen gas ambient at the temperature of 400° C. for 30 seconds, on the contrary, it can be seen that there appears a variation in the sheet resistance over the range of 10-30 Ω/□, while this suggests that, while the reaction forming the NiSi phase has proceeded sufficiently in the lower part of the silicide layer 6G in the structure of FIG. 1L, formation of the NiSi phase is incomplete in the surface part of the silicide layer 6G.

Figure 6:
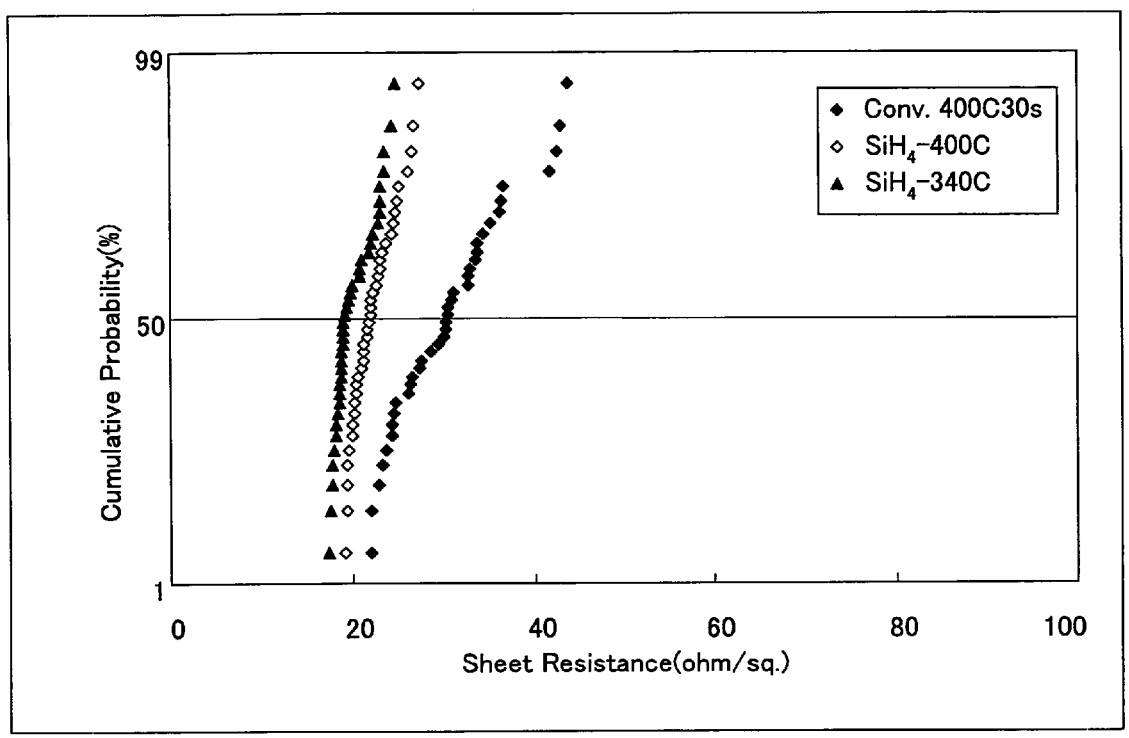
FIG. 6 is a diagram showing the cumulative frequency distribution of sheet resistance of the nickel monosilicide layers formed in the source/drain regions of the transistors fabricated according to the process of FIG. 2 in comparison with a comparative example.

FIG. 6 shows the cumulative frequency distribution of sheet resistance of the nickel monosilicide layer formed on a $p^+$-type diffusion region in correspondence to the NiSi silicide layers 1c and 1d according to the process steps 1-6 of FIG. 2, wherein the p-type diffusion region is formed on a silicon substrate with a width of 0.11 μm and a length of 100 μm.

Referring to FIG. 6, it is also observed that the sheet resistance value converges to the range of 20-25 Ω/□ in the case the nickel monosilicide layer is formed with the steps 1-6 of FIG. 2, while in the case the process of the step 6 is conducted in the nitrogen gas ambient at 400° C. for 30 seconds, the sheet resistance value scatters over the range of 20-45 Ω/□.

The result of FIG. 6, too, suggests that there remains the $Ni_2Si$ phase in the upper part of the "nickel monosilicide layer" even in the case reaction forming the NiSi phase has proceeded sufficiently in the lower part of the nickel monosilicide layer.

FIG. 7 shows the result of evaluation of the sheet resistance and uniformity of the NiSi nickel silicide layer for the case the hydrogen annealing process corresponding to FIG. 1K is conducted and not conducted in the step of FIG. 2. Here, it should be noted that, in the experiment of FIG. 7, a metallic nickel film is formed on a silicon substrate with a thickness of 20 nm, and a TiN film is formed further thereon with a thickness of 10 nm. Further, the structure thus obtained is annealed in a nitrogen gas ambient at the temperature of 240° C. for 180 seconds, and after removal of the remaining metallic nickel film by SPM, a thermal annealing process is applied in a monosilane ambient at the temperature in the range of 340-400° C.

Referring to FIG. 7, it can be seen that the sheet resistance of the nickel silicide layer of the NiSi phase is reduced and the uniformity of sheet resistance is improved by conducting the thermal annealing process in the hydrogen ambient at the temperature of 200° C. in advance of foregoing thermal annealing process in the monosilane gas ambient as compared with the case in which such a thermal annealing process is omitted.

From the foregoing, it becomes possible to suppress the leakage current of the junction on which a nickel silicide layer is formed, by conducting the thermal annealing process for converting the nickel silicide layer of the $Ni_2Si$ phase to the nickel monosilicide layer of the NiSi phase in the step 6 of FIG. 2. Further, it becomes possible to reduce the sheet resistance and reduce the variation of the sheet resistance.

Second Embodiment

FIGS. 8A-8E are diagrams showing the fabrication process of a semiconductor device according to a second embodiment of the present invention, wherein those parts corresponding to the parts described previously are designated by the same reference numerals and the description thereof will be omitted.

Figure 8A:
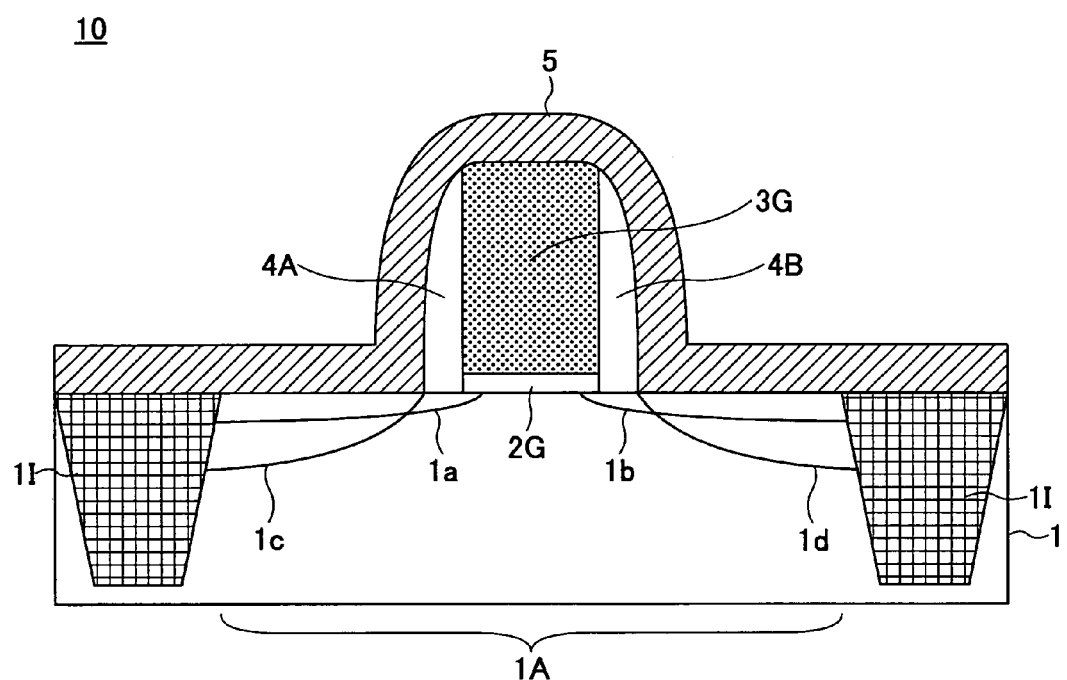
FIGS. 8A-8E are diagrams showing the fabrication process of semiconductor device according to a second embodiment of the present invention.

Referring to FIG. 8A, FIG. 8A represents the process step that follows the step of FIG. 1G and, after cleaning silicon surface by DHF or dry chemical cleaning, the metallic nickel film 5 is formed on the structure of FIG. 1G with the thickness of about 10 nm by a sputtering process, for example.

Figure 8B:
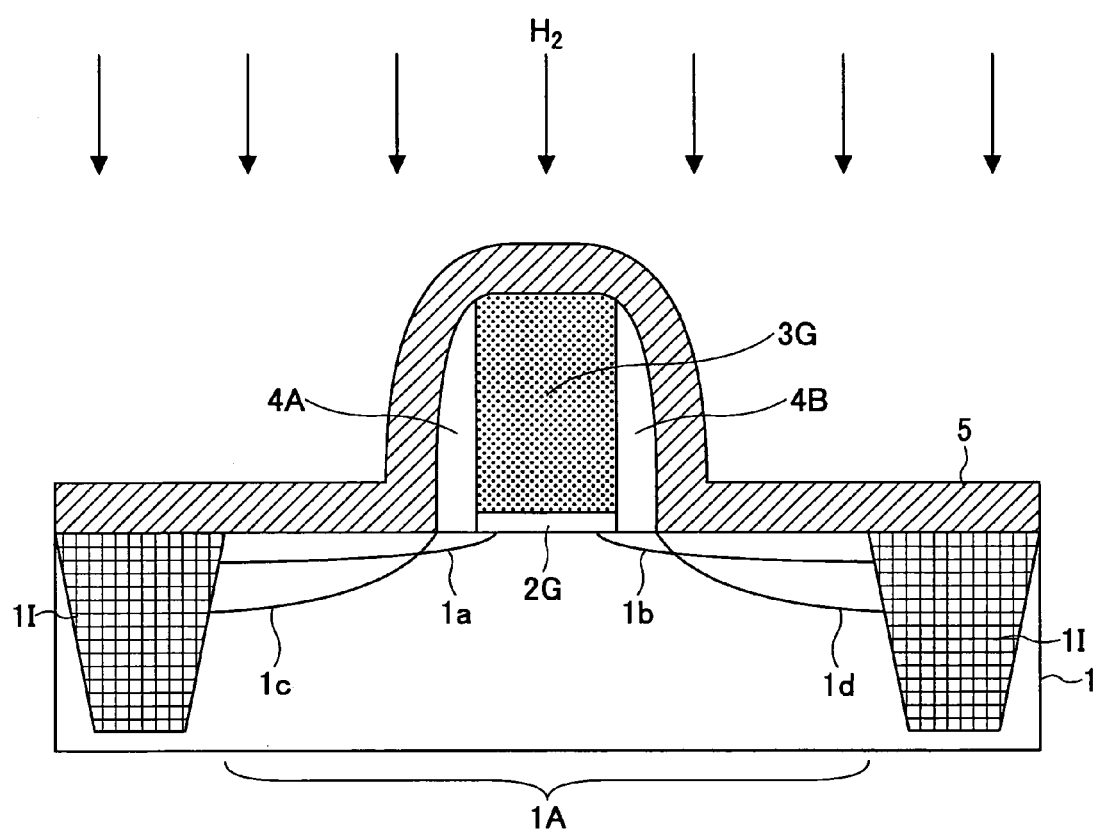

With the present embodiment, no protective film 5N is formed on the surface of the metallic nickel film 5, and the native oxide film of Ni formed on the surface of the metallic nickel film 5 is reduced to metallic Ni by annealing the structure of FIG. 8A in the hydrogen gas ambient in the subsequent process of FIG. 8B.

Figure 8C:
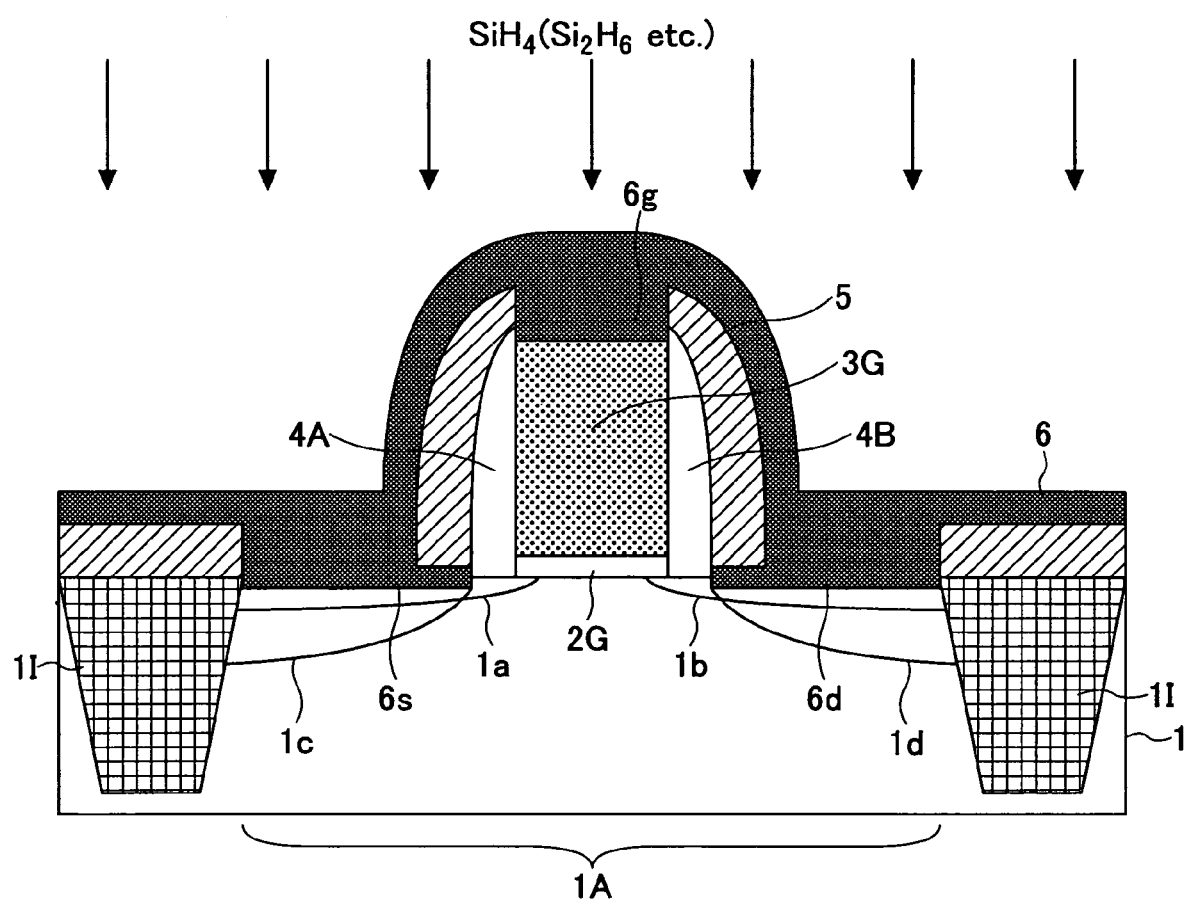

Next, in the step of FIG. 8C, the structure of the FIG. 8B is annealed in the silane gas ambient of mono silane or disilane at the temperature of 220° C., for example, and nickel silicide layers 6s, 6d and 6g primarily of the $Ni_2Si$ phase are formed respectively on the surfaces of the source region 1c, the drain region 1d and the polysilicon gate electrode 3G.

Further, in the step of FIG. 8C, a nickel silicide film 6 primarily of the $Ni_2Si$ phase is formed also on the surface of the metal nickel film 5. Thereby, the process of FIG. 8C is conducted such that not all the metallic nickel film 5 is converted to silicide. In other words, the process of FIG. 8C is conducted such that the metal nickel film 5 remains continuously.

With the step of FIG. 8C, the silicide-forming reaction of the metallic nickel film 5 proceeds not only from the interface to the source region 1c, the drain region 1d or the polysilicon gate electrode 3G but also from the surface of the metallic nickel film 5, and thus, the penetration depth of the silicide layers 6s and 6d into the silicon substrate 1 is reduced, and formation of the silicide layers 6s and 6d is limited to the surface part of the diffusion regions 1c and 1d.

Figure 8D:
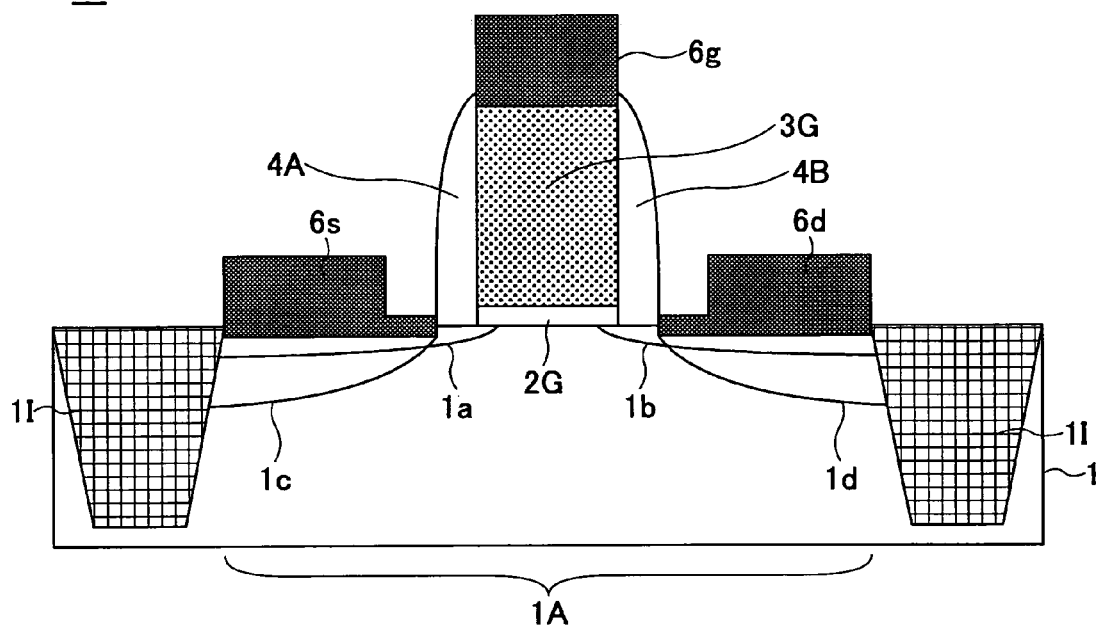

Next, in the step of FIG. 8D, the metallic nickel film 5 and the nickel silicide film 6 thereon are removed by applying ammoniac peroxide water mixture (APM) and sulfuric peroxide water mixture (SPM) consecutively. Further, in the step of FIG. 8E, the thermal annealing process for converting the nickel silicide layers 6s, 6d and 6g the Ni2Si phase to the nickel monosilicide layers 6S, 6D and 6G of the NiSi phase is conducted in the silane gas ambient such as monosilane or disilane at the temperature of 300-500° C.

Figure 8E:
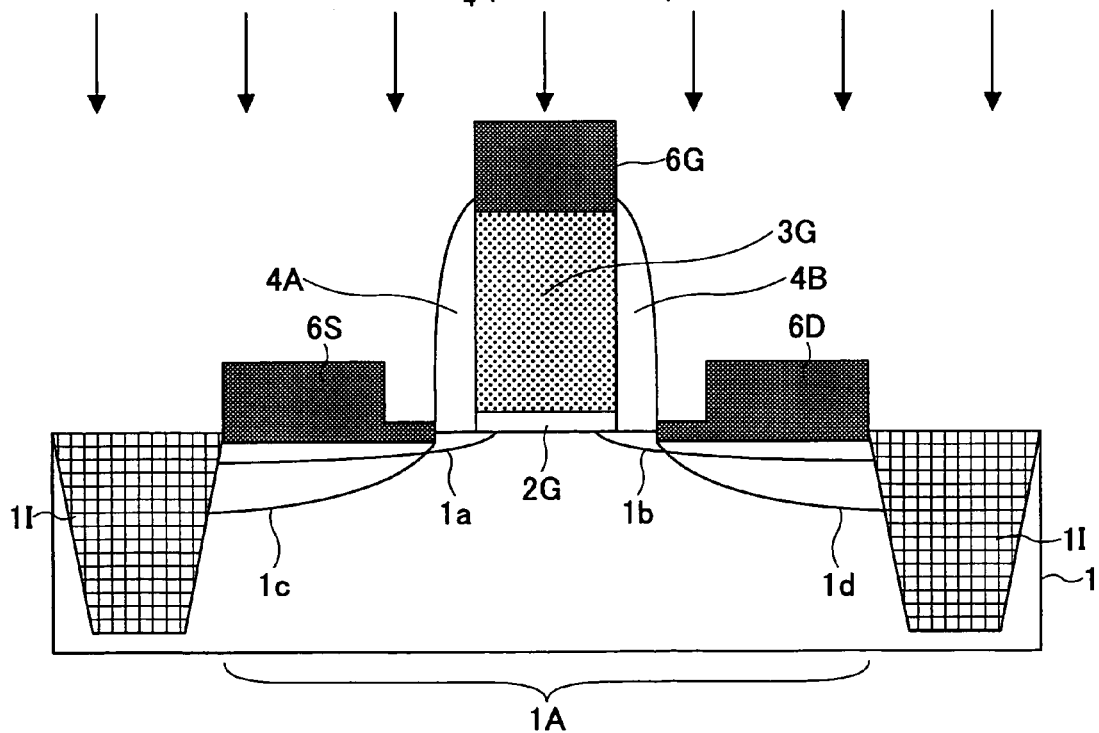

Because the conversion process is conducted in the silane gas ambient in the step of FIG. 8D, formation of the nickel monosilicide layers 6S and 6D of the NiSi phase, formed as a result of the conversion processing, is limited to the surface part of the source and drain regions 1c and 1d also in the step of FIG. 8E, and there is caused no destruction of junction at the diffusion regions 1c and 1d. Further, the conversion reaction to the nickel monosiliside phase proceeds sufficiently also on the surface of the silicide layers 6S, 6D and 6G, and as a result, a very uniform and low sheet resistance is realized in such a silicide region.

Third Embodiment

Next, the fabrication process of a CMOS device according to a third embodiment of the present invention will be described with reference to FIGS. 9A-9F.

Figure 9A:
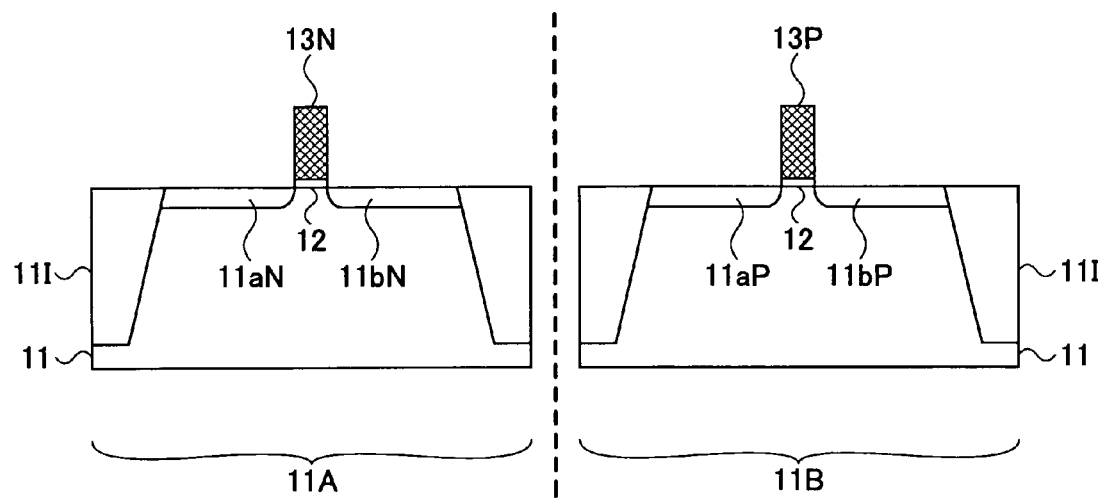
FIGS. 9A-9F are diagrams showing the fabrication process of semiconductor device according to a third embodiment of the present invention.

Referring to FIG. 9A, there are defined a device region 11A and a device region 11B respectively of an n-channel MOS transistor and a p-channel MOS transistor on a silicon substrate 11 by a device isolation structure 11I of STI type, wherein the device region 11A is doped to p-type and forms a p-type well. Further, the device region 11B is doped to n-type and forms an n-type well.

Further, in the device region 11A, ion implantation is conducted in the vicinity of the surface of the silicon substrate 11, although not illustrated, by a p-type impurity element for the purpose of threshold adjustment of the n-channel MOS transistor. Likewise, ion implantation is conducted in the vicinity of the surface of the silicon substrate 11 in the device region 11B, although not illustrated, by an n-type impurity element for the purpose of threshold adjustment of the p-channel MOS transistor.

In the device region 11A, there is formed a polysilicon gate electrode 13N via a gate insulation film 12 of a thermal oxide film or an SiON film, or alternatively of a so-called high-K dielectric film, while in the device region 11B, there is formed a polysilicon gate electrode 13P via the same gate insulation film 12. Further, there are formed source and drain extension regions 11aN and 11bN of n-type in the silicon substrate 11 within the device region 11A at the respective lateral sides of the polysilicon gate electrode 13N, and source and drain extension regions 11aP and 11bP of p-type are formed in the silicon substrate 11 within the device region 11B at the respective lateral sides of the polysilicon gate electrode 13P, by introducing an n-type impurity element and a p-type impurity element separately to the device region 11A and the device region 11B while using the gate electrode 13N or the gate electrode 13P as a self-alignment mask. Thus, in the case of introducing n-type impurity element, As+ may be introduced under the acceleration voltage of 1 keV with the dose of $2 \times 10^{15}$ cm$^{-2}$, while in the case of introducing p-type impurity element, B+ may be introduced under the acceleration voltage of 0.3 keV with the dose of $1 \times 10^{15}$ cm$^{-2}$. Here, it should be noted that the SiON film used for the gate insulation film may be formed by plasma nitridation of a thermal oxide film or by a plasma CVD process. Further, in the case of using a high-K dielectric film for the gate insulation film, it is possible to form the high-K dielectric film in the form of a metal oxide film such as HfO$_2$, ZrO$_2$, Al$_2$O$_3$, or the like, or a metal silicate such as HfSiO$_4$ or ZrSiO$_4$ by way of MOCVD process or atomic layer CVD process (so-called ALD process).

Figure 9B:
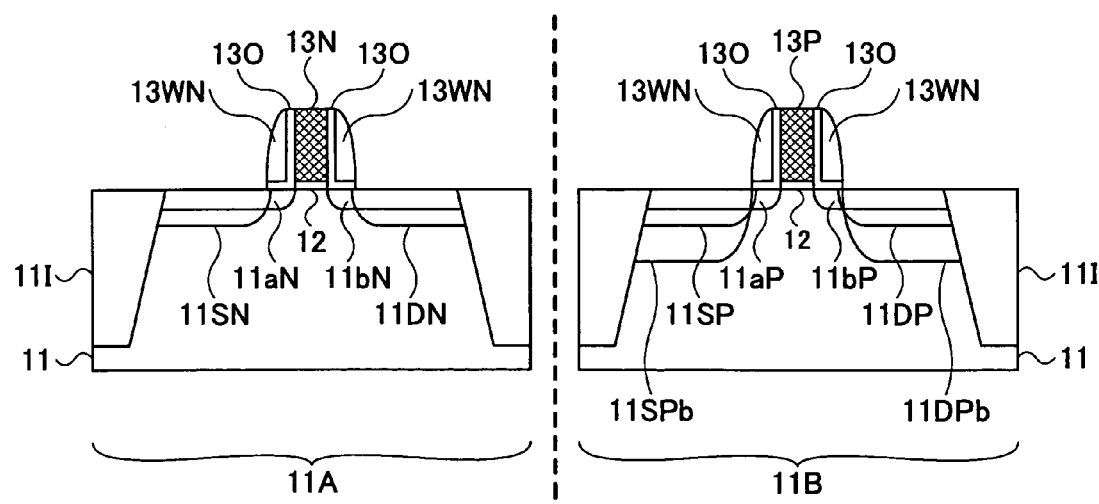

Next, in the step of FIG. 9B, a CVD oxide film 13O is formed on the surface of the silicon substrate 11 and the polysilicon gate electrodes 13N and 13P with a thickness of about 10 nm, such that the CVD oxide film 13O covers the exposed surface of the silicon substrate 11 and the surface of the polysilicon gate electrodes 13N and 13P continuously. Further, sidewall insulation films 13WN of SiON or SiN are formed on the sidewall surfaces of the polysilicon gate electrodes 13N and 13P via a via the foregoing CVD oxide film 13O with the thickness of 30 nm, for example, wherein the sidewall insulation films 13WN shows resistance against dry and wet etching of silicon and further against HF treatment.

It should be noted that such a sidewall insulation film 13WN can be formed by depositing an SiON film or SiN film on the structure of FIG. 9A by a low temperature process such as a plasma CVD process at the temperature of 600° C. or less such that the impurity distribution of the source and drain extension regions is not modified, followed by an etching back process conducted so as to expose the surface of the silicon substrate 11.

Further, in the step of FIG. 9B, the device region 11B is covered by a resist film not illustrated and an n-type impurity element such as As+ is introduced into the device region 11A under the acceleration voltage of 10 keV with the dose of $3 \times 10^{15}$ cm$^{-2}$ while using the sidewall insulation films 13WN as a mask. With this, deeper n-type diffusion regions are formed in the silicon substrate at the outer sides of the sidewall insulation films 13WN respectively as the source and drain regions 11SN and 11DN of the n-channel MOS transistor.

Further, in the step of FIG. 9B, the device region 11A is covered by a resist film not illustrated, and a p-type impurity element such as B+ is introduced into the device region 11B under the acceleration voltage of 3 keV with the dose of $1 \times 10^{15}$ cm$^{-2}$ while using the sidewall insulation films 13WN as a mask. With this, deeper p-type diffusion regions are formed in the silicon substrate at the outer sides of the sidewall insulation films 13WN respectively as the source and drain regions 11SP and 11DP of the p-channel MOS transistor.

Further, in the step of FIG. 9B, there are formed buffer source and drain regions 11SPb and 11DPb of p⁻-type respectively underneath the source and drain regions 11SP and 11DP of p-type by introducing a p-type impurity element such as B+ into the device region 11B by conducting an ion implantation process under the acceleration voltage of 10 keV with a smaller dose of $1 \times 10^{13}$ cm$^{-2}$ for the purpose of improving the breakdown characteristics of the source region 11SP and the drain region 11DP, while using the polysilicon gate electrode 13P, the sidewall oxide films 13O and the sidewall insulation films 13WN as a mask.

Figure 9C:
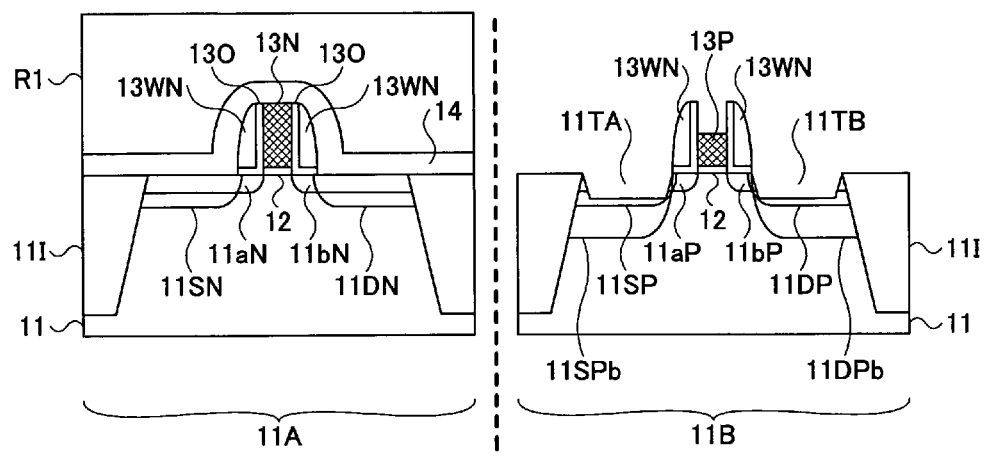

Next, in the step of FIG. 9C, a silicon oxide film 14 is deposited on the structure of FIG. 9B with a thickness of 50 nm, wherein the silicon oxide film 14 thus deposited is further removed from the device region 11B in the state the device region 11A is covered by a resist mask R1.

Further, in the step of FIG. 9C, a dry etching process or wet etching process that uses an organic alkali etchant or a combination thereof is applied to the silicon substrate 11 in the device region 11B in the state that the device region 11A is covered by the resist mask R1 while using the polysilicon gate electrode 13P and the sidewall insulation films 13WN as a self-aligned mask, and trenches 11TA and 11TB are formed in the silicon substrate at the respective outer sides of the sidewall insulation films 13WN with a depth not exceeding the depth of the source/drain regions 11SP and 11DP, such as 40 nm. The step of forming the trenches 11TA and 11TB may be conducted after removing the resist mask R1.

Further, after formation of such trenches 11TA and 11TB, the obtained structure is subjected to a wet etching process by using HF, and impurities such as etching residuals are removed from the bottom surface and sidewall surfaces of the trenches 11TA and 11TB.

Further, in the step of FIG. 9C, it should be noted that the polysilicon gate electrode 13P experiences partial etching with the formation of the trenches 11TA and 11TB in the silicon substrate 11.

Figure 9D:
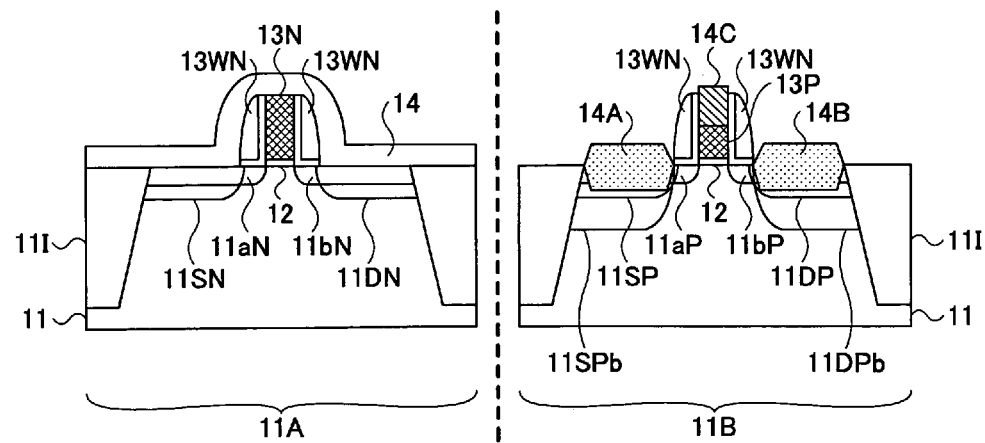

Next, in the step of FIG. 9D, the resist film R1 is removed, and the structure thus obtained is introduced into a low-pressure CVD apparatus. Therein, a silane (SiH$_4$) gas and a germane (GeH$_4$) gas are supplied together with a p-type dopant gas such as diborane at the temperature of 600° C. or less, and there are caused growth of SiGe mixed crystal layers 14A and 14B so as to fill the trenches 11TA and 11TB, respectively.

For example, growth of such SiGe mixed crystal layers 14A and 14B can be achieved in a hydrogen ambient of the pressure of 5-1330 Pa at the substrate temperature of 550° C. by controlling the partial pressure of SiH$_4$ to 1-10 Pa, the partial pressure of GeH$_4$ to 0.1-10 Pa and supplying a hydrochloric acid (HCl) etching gas with the partial pressure of 1-10 Pa.

With such epitaxial growth of the SiGe mixed crystal layers 14A and 14B, there also occurs growth of a polycrystalline SiGe layer 14C on the polysilicon gate electrode 13P.

It should be noted that the growth of the SiGe layers 14A-14C is conducted for the duration of 1-40 minutes, and as a result, the SiGe mixed crystal layers 14A and 14B filling the trenches 11TA and 11TB grows beyond the interface between the silicon substrate 11 and the gate insulation film 12.

As a result of formation of the SiGe mixed crystal layers 14A and 14B, a large uniaxial compressive stress is applied to the channel region right underneath the gate insulation film 12, and there occurs significant increase in the mobility of holes transported through the channel region.

As a result of such a low temperature growth caused in a limited area, it was confirmed that the SiGe mixed crystal layers 14A and 14B can contain Ge with a concentration of 28% in terms of atomic concentration, which exceeds the atomic concentration of 20% conventionally accepted as the limiting concentration, without degrading the crystal quality.

In the structure of FIG. 9D, the trenches 11TA and 11TB are formed in the step of FIG. 9C while using the sidewall insulation films 13WN as a self-alignment mask, and thus, the SiGe mixed crystal layers 14A and 14B are formed with closest relationship to the channel region. Thus, it becomes possible to maximize the uniaxial compressive stress applied to the channel region.

In the step of FIG. 9D, the device region 11A is further covered with a resist pattern, and B+ is introduced into the SiGe mixed crystal layers 14A and 14B with an ion implantation process conducted under the acceleration voltage of 5 keV with the dose of $5\times10^{15}$ cm$^{-2}$. With this, the SiGe mixed crystal layers 14A and 14B are doped to p-type. It should be noted that the SiGe mixed crystal layers 14A and 14B constitute a part of the p-type source and drain regions 11DP and 11DP, respectively.

In the process of FIG. 9D, it is also possible to added a p-type dopant gas such as $B_2H_6$ to the source gas when growing the SiGe mixed crystal layers 14A and 14B epitaxially. In this case, the SiGe mixed crystal layers 14A and 14B are doped to p-type without conducting a separate ion implantation process.

Figure 9E:
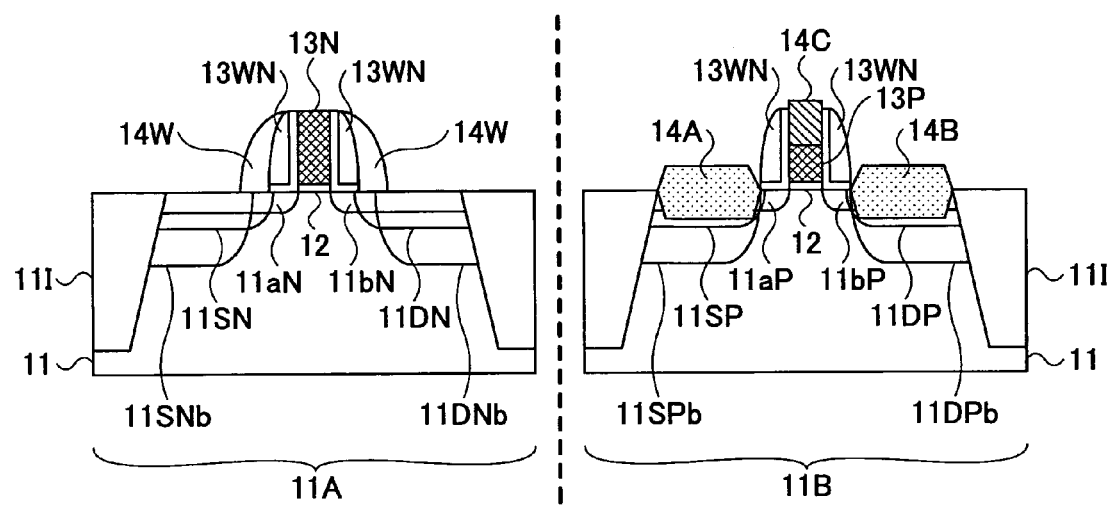

Further, in the step of FIG. 9E, the CVD oxide film 14 left in the device region 11A is etched back until the surface of the silicon substrate 11 is exposed, and as a result, there are formed outer sidewall oxide films 14W in the device region 11A at further outer sides of the SiN sidewall insulation films 13WN of the gate electrode 13N. Further, the device region 11B is covered with a resist mask not illustrated, and buffer source/drain regions 11SNb and 11DNb of n⁻-type are formed in the silicon substrate at a depth deeper than the source and drain regions 11SN and 11DN by introducing an n-type impurity element such as P+ by an ion implantation process under the acceleration voltage of 15 keV with the dose of $7\times10^{13}$ cm$^{-2}$ while using the polysilicon gate electrode 13N, the sidewall oxide films 13O, the sidewall insulation films 13NW and the outer sidewall oxide films 14W as a mask.

By forming the buffer source/drain regions 11SNb and 11DNb at further outer sides of the outer sidewall oxide films 14W, it becomes possible to secure a sufficient distance between the diffusion regions 11SNb and 11DNb, and occurrence of leakage current via such diffusion regions can be suppressed successfully.

After the step of FIG. 9E, a salicide process is conducted, and there are formed silicide layers 16S, 15D and 16G of nickel monosilicide phase on the source and drain regions 11SN and 11DN of n-type, on the source and drain regions 11SP and 11DP of p-type, on the polysilicon gate electrode 13N of n-type, and on the polysilicon gate electrode 13P of p-type.

According to the present invention, it becomes possible to construct a high-speed CMOS device by forming the n-channel MOS transistor and p-channel MOS transistor on a common substrate.

Figure 9F:
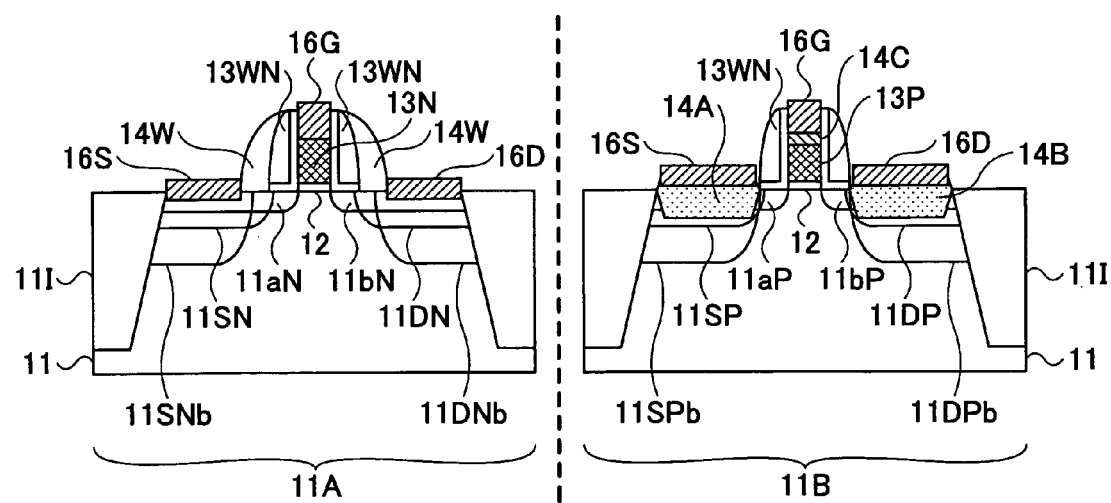

FIGS. 10A-10D show the process of the FIG. 9F in detail.

Figure 10A:
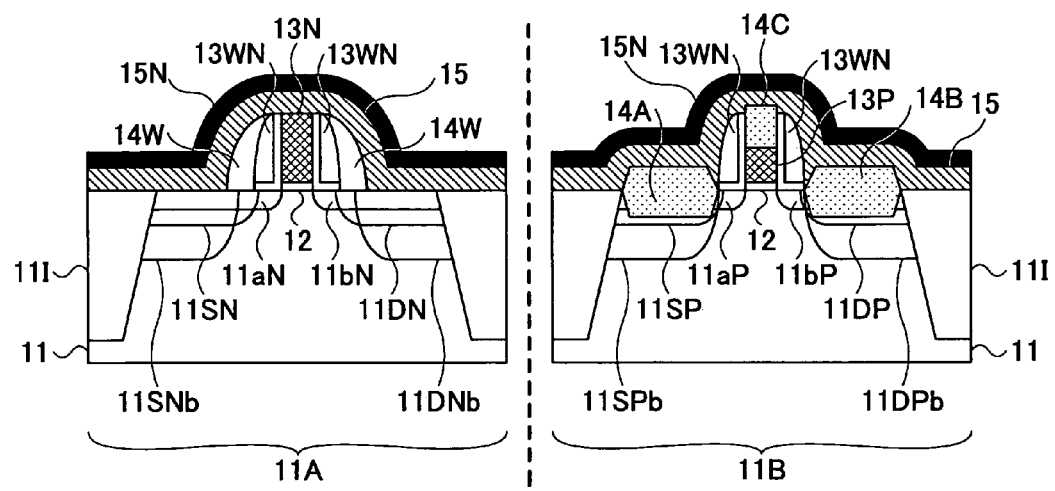
FIGS. 10A-10D are diagrams showing the details of the process of FIG. 9F.

Referring to FIG. 10A, after cleaning silicon surface by DHF or dry chemical cleaning, a metallic nickel film 15 is formed on the structure of FIG. 9E by a sputtering process or electrons beam evaporation deposition process with the film thickness of about 10 nm, further, a TiN film 15N is formed on the metallic nickel film 15 by a reactive sputtering process with the thickness of about 10 nm.

Figure 10B:
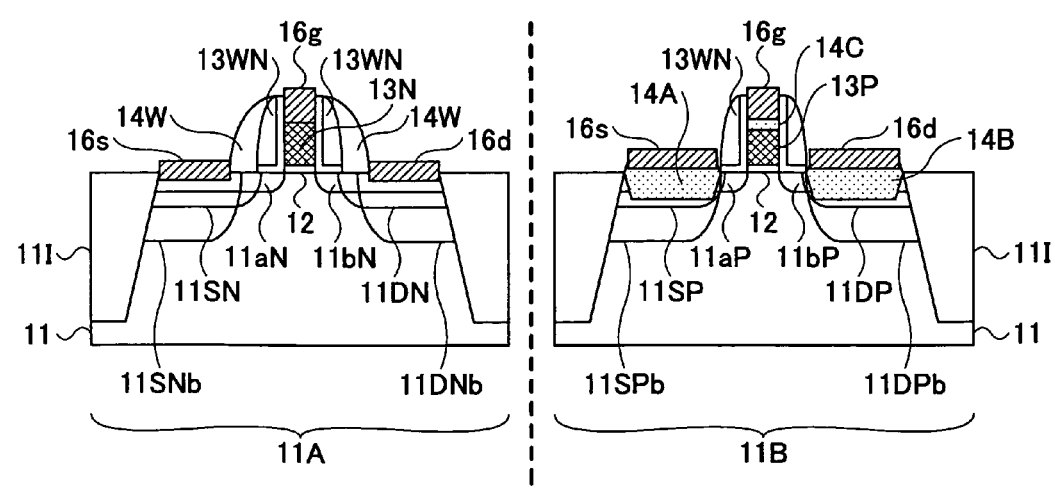

Next, in the step of FIG. 10B, the structure of FIG. 10A is subjected to a thermal annealing process in an Ar gas ambient at the temperature of 240° C. for 180 seconds, and with this, nickel silicide layers 16s, 16d and 16g of $Ni_2Si$ phase are formed respectively on the surface of the source region 11SN and the SiGe mixed crystal layer 11SP, on the surface of the drain region 11DN and the SiGe mixed crystal layer 14B, and on the surface of the gate electrodes 13N and 13P.

In the step of FIG. 10B, the metallic nickel film 15 and the TiN film 15N thereon are removed by a selective wet etching process that uses SPM.

Figure 10C:
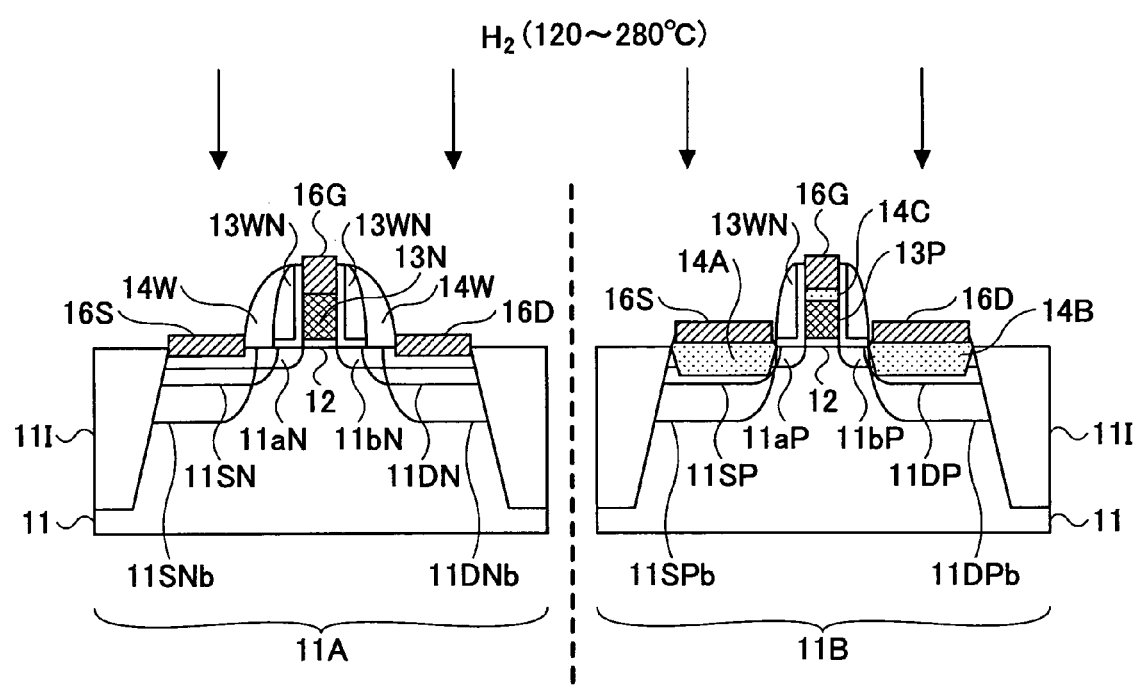

Next, in the step of FIG. 10C, the structure of FIG. 10B is introduced into a CVD apparatus such as a low-pressure CVD apparatus and the native oxide film formed on the surface of the nickel silicide layers 16s, 16d and 16g are removed by a hydrogen ambient under the pressure of $1\times10^4$ Pa at the temperature of 140-200° C. for 30-60 seconds.

Because the wet etching process for removing the metallic nickel film 15 and the TiN film 15N is conducted in the atmospheric environment, it should be noted that there is a possibility of formation of native oxide film on the surface of the exposed nickel silicide layers 16s, 16d and 16g. Because SiGe mixed crystal regions 14A and 14B, on which silicide formation is to be conducted, are formed in an amorphous state as a result of the ion implantation process conducted in the step of FIG. 10B, the silicide formation process of FIG. 10C proceeds uniformly even when the silicide formation reaction is conducted on a SiGe mixed crystal layer.

Figure 10D:
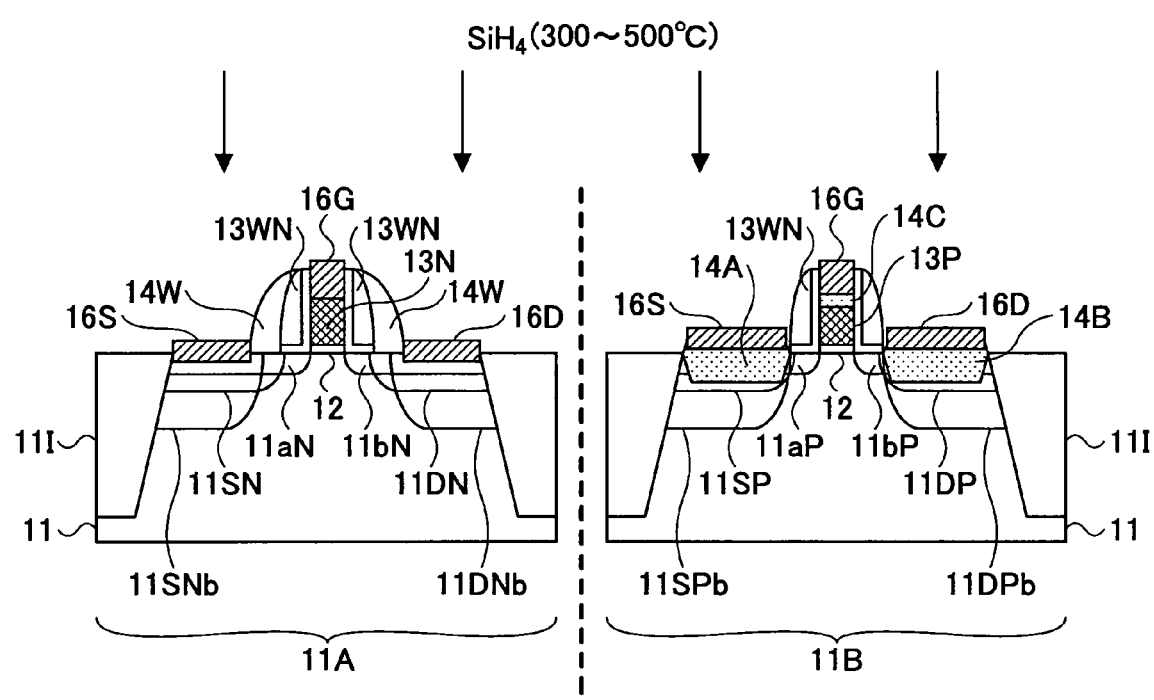

Next, in the step of FIG. 10D, a thermal annealing process is conducted continuously in the same CVD apparatus in a gas ambient of monosilane ($SiH_4$) or disilane ($Si_2H_6$) under the pressure of 1×104 Pa at the temperature of 300-500° C., preferably 340-400° C. for 30-600 seconds. With this, the nickel silicide layers 16s, 16d and 16g of $Ni_2Si$ phase are converted respectively to nickel monosilicide layers 16S, 16D and 16G primarily of the NiSi phase.

According to the present invention, it becomes possible to induce an uniaxial compressive stress acting parallel to the substrate surface in the channel region right underneath the gate electrode 14C by forming SiGe epitaxial regions 14A and 14B having a lattice constant larger than that of the silicon substrate 11 respectively in correspondence to a source region and a drain region of the p-channel MOS transistor in the device region 11B, and with this, it becomes possible to improve the mobility of the holes in the channel region significantly.

Thereby, it becomes possible to form the low-resistance silicide layers 16S and 16D on the SiGe mixed crystal regions 14A and 14B by using nickel silicide. Because the silicide formation process of FIG. 10C is conducted in the silane ambient similarly to the previous embodiments, the penetration depth of the low-resistance silicide layers 16S and 16D into the silicon underlying layer is suppressed within 20 nm, and there arises no such a problem that the silicide layers 16S and 16D penetrate through the shallow source and drain regions and cause short circuit to the well constituting the device region.

Particularly, with the present invention, it is possible to expose a crystal surface such as Si(111) surface on the sidewall surfaces of the trenches 11TA and 11TB by using a wet etching process in the trench forming process of FIG. 9C, and it is possible to improve the quality of crystal of the SiGe mixed crystal layers 14A and 14B grown epitaxially in the step of FIG. 9D.

Further, by combining the dry etching process and wet etching process in the trench forming process, it is possible to form the sidewall surfaces of the trenches 11TA and 11TB to form a wedge shape cutting into the channel region right underneath the gate insulation film 12 as shown in FIG. 9D.

With such a structure, tip end parts of the SiGe mixed crystal layers 14A and 14B filling the trenches 11TA and 11TB invade to the region right underneath the sidewall insulation films 13WN and reach the close proximity of the channel region, and thus, there is caused further increase of the uniaxial compressive stress in the channel region. Thereby, the operational speed of the p-channel MOS transistor can be increased further.

While the present invention has been described with regard to the MOS transistor and CMOS device formed on a bulk silicon substrate, the present invention is also effective in the MOS transistors or CMOS devices formed on an SOI substrate.

While the present invention has been explained for various preferred embodiments, it should be noted that the present invention is by no means limited to such a specific embodiment and various variations and modifications may be made without departing from the scope of the invention.

What is claimed is:

1. A method of fabricating a semiconductor device, comprising the step of forming a nickel monosilicide layer selectively over a silicon region defined by an insulation film by a self-aligned process, said self-aligned process comprising the steps of:
   forming a metallic nickel film on a silicon substrate on which said insulation film and said silicon region are formed, such that said metallic nickel film covers said insulation film and said silicon region;
   forming a first nickel silicide layer primarily of a $Ni_2Si$ phase on a surface of said silicon region of said metallic nickel film by applying an annealing process to said silicon substrate;
   removing said metallic nickel film, after said step of forming said first nickel silicide layer, by a selective wet etching process; and
   converting said first nickel silicide layer to a second nickel silicide layer primarily of a NiSi phase by a thermal annealing process conducted in a silane gas.

2. The method as claimed in claim 1, wherein said converting step is conducted at a temperature of 340-400° C.

3. The method as claimed in claim 1, further comprising, after said step of selective wet etching process but before said converting step, the step of applying a reducing processing to a surface of said first nickel silicide layer in a reducing ambient.

4. The method as claimed in claim 3, wherein said reducing processing is conducted at a temperature of 120-280° C. in a hydrogen ambient.

5. The method as claimed in claim 1, wherein said step of forming said first nickel silicide layer is conducted in the state in which a surface of said metallic nickel film is covered by a protective film.

6. The method as claimed in claim 1, wherein said step of forming said first nickel silicide layer is conducted by exposing a surface of said metallic nickel film to said silane gas.

7. The method as claimed in claim 6, further comprising a step of reducing said surface of said metallic nickel film in a reducing ambient after said step of forming said metallic nickel film but before said step of forming said first nickel silicide layer.

8. A method of fabricating a semiconductor device, comprising the steps of:
   forming a device isolation structure on a substrate such that said device isolation structure defines a device region in the form of a silicon surface;
   forming a gate electrode over said device region via a gate insulation film formed on said silicon surface in said device region;
   forming first and second sidewall insulation films on respective sidewall surfaces of said gate electrode;
   forming a source region and a drain region in said substrate within said device region at respective outer sides of said first and second sidewall insulation films; and
   forming first and second nickel monosilicide layers primarily of a NiSi phase respectively on a surface of said source region and a surface of said drain region,
   said step of forming said first and second nickel monosilicide layers comprises the steps of
   depositing a metallic nickel film on said substrate so as to cover said source and drain regions and further said gate electrode including said first and second sidewall insulation films;
   forming first and second nickel silicide layers primarily of a $Ni_2Si$ phase respectively on said surface of said source region and said surface of said drain region by applying a thermal annealing process to said metallic nickel film;
   removing said metallic nickel film after formation of said first and second nickel silicide layers by a selective wet etching process; and
   converting said first and second nickel silicide layers respectively to a first and second nickel monosilicide layers in said source and drain regions by way of a thermal annealing process conducted in a silane gas ambient.

9. The method as claimed in claim 8, wherein said thermal annealing process of said converting step is conducted at a temperature of 340-400° C.

10. The method as claimed in claim 8, further comprising the step, after said step of selective wet etching process but before said step of forming said first and second nickel monosilicide layers, of processing said first and second nickel silicide films in a reducing ambient.

11. The method as claimed in claim 10, wherein said step of processing in said reducing ambient is conducted in a hydrogen gas ambient at a temperature of 120-280° C.

12. The method as claimed in claim 8, wherein said step of forming said source and drain regions includes the step of introducing an impurity element into said device region by an ion implantation process while using said gate electrode and said first and second sidewall insulation films as a mask.

13. The method as claimed in claim 8, wherein each of said source and drain regions comprises a SiGe mixed crystal layer.

14. The method as claimed in claim 13, wherein said step of forming said source and drain regions comprises the steps of:
   forming first and second depressions in said device region at respective outer sides of said first and second sidewall insulation films by applying an etching process to said silicon surface at said outer sides of said first and second sidewall insulation films; and growing SiGe mixed crystal layers respectively in said first and second depressions epitaxially.

* * * * *